(12) United States Patent
Kim et al.

(10) Patent No.: US 11,649,401 B2
(45) Date of Patent: May 16, 2023

(54) QUANTUM DOT-CONTAINING MATERIAL, METHOD OF PREPARING THE SAME, AND OPTICAL MEMBER AND APPARATUS INCLUDING THE QUANTUM DOT-CONTAINING MATERIAL

(71) Applicant: Samsung Display Co., Ltd., Yongin-si (KR)

(72) Inventors: Sehun Kim, Yongin-si (KR); Changhee Lee, Yongin-si (KR); Junbo Sim, Yongin-si (KR); Jaekook Ha, Yongin-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 276 days.

(21) Appl. No.: 16/924,658

(22) Filed: Jul. 9, 2020

(65) Prior Publication Data
US 2021/0009893 A1    Jan. 14, 2021

(30) Foreign Application Priority Data

Jul. 12, 2019  (KR) .................. 10-2019-0084547
Jul. 6, 2020   (KR) .................. 10-2020-0082962

(51) Int. Cl.
| | |
|---|---|
| *C09K 11/02* | (2006.01) |
| *C09K 11/70* | (2006.01) |
| *C09K 11/08* | (2006.01) |
| *H01L 33/50* | (2010.01) |
| *H01L 51/50* | (2006.01) |

(Continued)

(52) U.S. Cl.
CPC .......... *C09K 11/02* (2013.01); *C09K 11/0883* (2013.01); *C09K 11/703* (2013.01); *B82Y 20/00* (2013.01); *B82Y 40/00* (2013.01)

(58) Field of Classification Search
CPC ... C09K 11/02; C09K 11/0883; C09K 11/703; B82Y 20/00; B82Y 40/00
See application file for complete search history.

(56) References Cited

U.S. PATENT DOCUMENTS

| | | |
|---|---|---|
| 9,902,902 B2 | 2/2018 | Jang et al. |
| 10,014,447 B2 | 7/2018 | Pickett et al. |
| 10,365,509 B2 | 7/2019 | Jeon et al. |

(Continued)

FOREIGN PATENT DOCUMENTS

| | | |
|---|---|---|
| CN | 102217106 A | 10/2011 |
| CN | 103228983 A | 7/2013 |

(Continued)

OTHER PUBLICATIONS

Maheswara, Muchchintala et al.; "High refractive index of transparent acrylate polymers functionalized with alkyl sulfur groups"; Polymer Journal; 2010; 42; pp. 249-255.

*Primary Examiner* — Tracie Y Green
(74) *Attorney, Agent, or Firm* — Lewis Roca Rothgerber Christie LLP

(57) ABSTRACT

A quantum dot-containing material includes: a quantum dot-containing complex including a quantum dot and a first matrix material; and a second matrix material, wherein the quantum dot is dispersed in the first matrix material, the quantum dot-containing complex is dispersed in the second matrix material, and a refractive index of the first matrix material is greater than that of the second matrix material.

20 Claims, 1 Drawing Sheet

(51) Int. Cl.
    *B82Y 20/00*        (2011.01)
    *B82Y 40/00*        (2011.01)

(56)            References Cited

U.S. PATENT DOCUMENTS 10,642,139  B2      5/2020   Pousthomis et al.
    10,983,432  B2 *    4/2021   Jun ........................ G02B 5/207
    11,091,691  B2 *    8/2021   Fang ................... C08F 290/067
    2010/0123155 A1     5/2010   Pickett et al.
    2011/0068321 A1     3/2011   Pickett et al.
    2012/0113672 A1     5/2012   Dubrow et al.
    2013/0105854 A1     5/2013   Jang et al.
    2014/0342482 A1 *  11/2014   Morimoto ........... H01L 51/5012
                                                            118/301
    2017/0279013 A1     9/2017   Vo et al.
    2019/0129302 A1     5/2019   Youn et al.

FOREIGN PATENT DOCUMENTS

JP              6287212  B2 *   3/2018   ............. C09K 11/00
    KR      10-2006-0084668  A      7/2006
    KR      10-2012-0062902  A      6/2012
    KR      10-2016-0111142  A      9/2016
    KR      10-2017-0099026  A      8/2017
    KR      10-2018-0090554  A      8/2018
    KR      10-2019-0042212  A      4/2019
    KR      10-2019-0047573  A      5/2019
    KR         10-1977123    B1     5/2019
    WO          2017/166106  A1    10/2017
    WO           2018220166  A1    12/2018

* cited by examiner

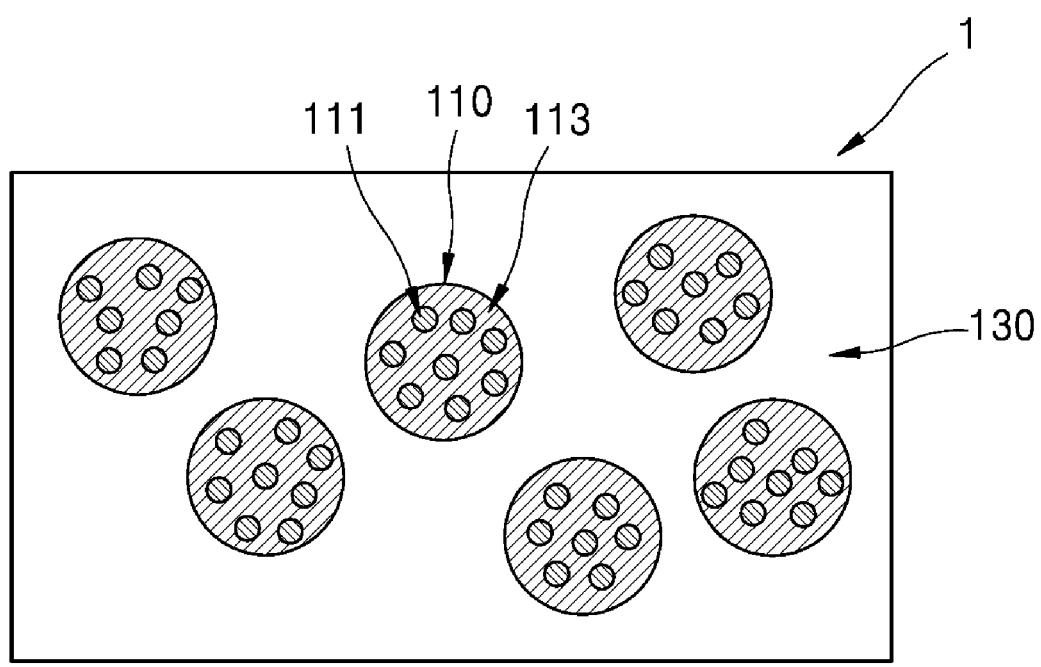

QUANTUM DOT-CONTAINING MATERIAL, METHOD OF PREPARING THE SAME, AND OPTICAL MEMBER AND APPARATUS INCLUDING THE QUANTUM DOT-CONTAINING MATERIAL

CROSS-REFERENCE TO RELATED APPLICATION

This application claims priority to and the benefit of Korean Patent Application Nos. 10-2019-0084547, filed on Jul. 12, 2019, and 10-2020-0082962, filed on Jul. 6, 2020, in the Korean Intellectual Property Office, the entire contents of all of which are incorporated herein by reference.

BACKGROUND

1. Field

The present disclosure relates to a quantum dot-containing material, a method of preparing the same, and an optical member and an apparatus that include the quantum dot-containing material.

2. Description of the Related Art

Among optical members, a quantum dot may be used as a material capable of performing various optical functions (for example, light conversion functions). A quantum dot, which is a nano-scale semiconductor nanocrystal, may have different energy gaps depending on the size and composition of the nanocrystal, and accordingly, may emit light with various emission wavelengths.

An optical member including the quantum dot may have a thin-film form, for example, a thin-film form patterned according to a sub-pixel. Such an optical member may also be utilized as a color conversion member of an apparatus having various light sources.

To implement a high-quality apparatus, there is still a need to develop a color conversion member that is able to provide excellent light conversion efficiency.

SUMMARY

One or more aspects of embodiments of the present disclosure are directed toward a quantum dot-containing material capable of providing excellent (or suitable) light conversion efficiency, a method of preparing the quantum dot-containing material and an optical member and an apparatus that include the quantum dot-containing material and accordingly have excellent (or suitable) light conversion efficiency.

Additional aspects will be set forth in part in the description which follows and, in part, will be apparent from the description, or may be learned by practice of the presented embodiments.

An embodiment of the present disclosure provides a quantum dot-containing material including:
a quantum dot-containing complex including a quantum dot and a first matrix material; and
a second matrix material,
wherein the quantum dot is dispersed in the first matrix material,
the quantum dot-containing complex is dispersed in the second matrix material, and
a refractive index of the first matrix material is greater than that of the second matrix material.

The quantum dot-containing material may be in a thin-film form. That is, the quantum dot-containing material may be a quantum dot-containing thin-film.

Another embodiment of the present disclosure provides a method of preparing a quantum dot-containing material, the method including:
preparing a first composition including a quantum dot, a first monomer, a polymerization initiator, and a solvent;
preparing a second composition by converting the first monomer in the first composition into at least a part of a first matrix material, the second composition including a quantum dot-containing complex and the solvent, the quantum dot-containing complex including the quantum dot and the first matrix material, in which the quantum dot is dispersed;
obtaining the quantum dot-containing complex by removing the solvent from the second composition;
preparing a third composition including the quantum dot-containing complex, a second monomer, a polymerization initiator, and a solvent; and
preparing a quantum dot-containing material by converting the second monomer in the third composition into at least a part of a second matrix material, the quantum dot-containing material comprising the quantum dot-containing complex and the second matrix material, in which the quantum dot-containing complex is dispersed,
wherein a refractive index of the first matrix material is greater than that of the second matrix material.

Another embodiment of the present disclosure provides an optical member including the quantum dot-containing material.

The optical member may be a color conversion member.

Another embodiment of the present disclosure provides an apparatus including the quantum dot-containing material.

The apparatus may further include a light source, and the quantum dot-containing material may be arranged in a path of light emitted from the light source.

The light source may be an organic light-emitting device (OLED) or a light-emitting diode (LED).

The light source may emit blue light.

BRIEF DESCRIPTION OF THE DRAWING

These and/or other aspects will become apparent and more readily appreciated from the following description of the embodiments, taken in conjunction with the drawing, which is a schematic view of a quantum dot-containing material according to an embodiment.

DETAILED DESCRIPTION

Reference will now be made in more detail to embodiments, examples of which are illustrated in the accompanying drawing, wherein like reference numerals refer to like elements throughout. In this regard, the present embodiments may have different forms and should not be construed as being limited to the descriptions set forth herein. Accordingly, the embodiments are merely described below, by referring to the drawing, to explain aspects of the present description. As used herein, the term "and/or" includes any and all combinations of one or more of the associated listed items. Expressions such as "at least one of," "one of," and "selected from," when preceding a list of elements, modify the entire list of elements and do not modify the individual elements of the list. Further, the use of "may" when describing embodiments of the present invention refers to "one or more embodiments of the present invention."

In the drawing, a quantum dot-containing material 1 may include a quantum dot-containing complex 110 and a second matrix material 130. The quantum dot-containing material 1 may include a plurality of the quantum dot-containing complexes 110.

The second matrix material 130 refers to a material other than the quantum dot-containing complex 110 in the quantum dot-containing material 1, and may be a mixture of two or more different materials.

The quantum dot-containing complex 110 may be dispersed in the second matrix material 130.

The quantum dot-containing complex 110 may include a quantum dot 111 and a first matrix material 113. The quantum dot-containing complex 110 may include a plurality of the quantum dots 111.

The first matrix material 113 refers to a material other than the quantum dot 111 in the quantum dot-containing complex 110, and may be a mixture of two or more different materials.

The quantum dot 111 may be dispersed in the first matrix material 113.

The quantum dot 111 may be a quantum dot particle capable of emitting light by light stimulation. For example, the quantum dot 111 may include a group II-VI semiconductor compound; a group III-VI semiconductor compound; a group III-V semiconductor compound; a group IV-VI semiconductor compound; a group IV element or compound including the same; a group I-III-VI semiconductor compound; or any combination thereof.

The group II-VI semiconductor compound may include: a binary compound, such as CdS, CdSe, CdTe, ZnS, ZnSe, ZnTe, ZnO, HgS, HgSe, HgTe, MgS, MgSe, and/or the like; a ternary compound, such as CdSeS, CdSeTe, CdالسTe, ZnSeS, ZnSeTe, ZnSTe, HgSeS, HgSeTe, HgSTe, CdZnS, CdZnSe, CdZnTe, CdHgS, CdHgSe, CdHgTe, HgZnS, HgZnSe, HgZnTe, MgZnS, MgZnSe, and/or the like; a quaternary compound, such as CdZnSeS, CdZnSeTe, CdZnSTe, CdHgSeS, CdHgSeTe, CdHgSTe, HgZnSeS, HgZnSeTe, HgZnSTe, and/or the like; or any combination thereof.

The group III-VI semiconductor compound may include: a binary compound, such as $In_2S_3$, $In_2Se_3$, and/or the like; a ternary compound, such as $InGaS_3$, $InGaSe_3$, and/or the like; or any combination thereof.

The group III-V semiconductor compound may include: a binary compound, such as GaN, GaP, GaAs, GaSb, AlN, AlP, AlAs, AlSb, InN, InP, InAs, InSb, and/or the like; a ternary compound, such as GaNP, GaNAs, GaNSb, GaPAs, GaPSb, AlNP, AlNAs, AlNSb, AlPAs, AlPSb, InGaP, InAlP, InNP, InNAs, InNSb, InPAs, InPSb, and/or the like; a quaternary compound, such as GaAlNP, GaAlNAs, GaAlNSb, GaAlPAs, GaAlPSb, GaInNP, GaInNAs, GaInNSb, GaInPAs, GaInPSb, InAlNP, InAlNAs, InAlNSb, InAlPAs, InAlPSb, and/or the like; or any combination thereof. The group III-V semiconductor compound may further include a group II metal (e.g., the group III-V semiconductor compound may include InZnP and/or the like).

The group IV-VI semiconductor compound may include: a binary compound, such as SnS, SnSe, SnTe, PbS, PbSe, PbTe, and/or the like; a ternary compound, such as SnSeS, SnSeTe, SnSTe, PbSeS, PbSeTe, PbSTe, SnPbS, SnPbSe, SnPbTe, and/or the like; and a quaternary compound, such as SnPbSSe, SnPbSeTe, SnPbSTe, and/or the like; or any combination thereof.

The group IV element or a compound including the same may include: Si and/or Ge; a binary compound, such as SiC, SiGe, and/or the like; or any combination thereof.

The group I-III-VI semiconductor compound may include: a ternary compound, such as AgInS, $AgInS_2$, CuInS, $CuInS_2$, $CuGaO_2$, $AgGaO_2$, $AgAlO_2$, and/or the like; or any combination thereof.

The quantum dot 111 may have a single (e.g., homogenous) structure in which components and compositions thereof are homogenous; or a composite structure, such as a core-shell structure, a gradient structure, and/or the like. In the core-shell structure, the shell may be single layer in which components and compositions thereof are homogeneous, or a multilayer having two or more layers with different components and/or compositions.

For example, in the core-shell structure, each of a material for forming the core and a material for forming the shell may be selected from the semiconductor compounds described above.

In one or more embodiments, the quantum dot 111 may include the group III-V semiconductor compound.

In one or more embodiments, the quantum dot 111 may include In.

In one or more embodiments, the quantum dot 111 may include In and P.

In one or more embodiments, the quantum dot 111 may include the group III-V semiconductor compound and the group II-VI semiconductor compound.

In one or more embodiments, the quantum dot 111 may have a core-shell structure. The core may include the group III-V semiconductor compound, and the shell may include the group II-VI semiconductor compound.

In one or more embodiments, the quantum dot 111 may have a core-shell structure. The core may include GaN, GaP, GaAs, GaSb, AlN, AlP, AlAs, AlSb, InN, InP, InAs, InSb, GaNP, GaNAs, GaNSb, GaPAs, GaPSb, AlNP, AlNAs, AlNSb, AlPAs, AlPSb, InGaP, InAlP, InNP, InNAs, InNSb, InPAs, InPSb, GaAlNP, GaAlNAs, GaAlNSb, GaAlPAs, GaAlPSb, GaInNP, GaInNAs, GaInNSb, GaInPAs, GaInPSb, InAlNP, InAlNAs, InAlNSb, InAlPAs, InAlPSb, or any combination thereof, and the shell may include CdS, CdSe, CdTe, ZnS, ZnSe, ZnTe, ZnO, HgS, HgSe, HgTe, MgS, MgSe, CdSeS, CdSeTe, CdSTe, ZnSeS, ZnSeTe, ZnSTe, HgSeS, HgSeTe, HgSTe, CdZnS, CdZnSe, CdZnTe, CdHgS, CdHgSe, CdHgTe, HgZnS, HgZnSe, HgZnTe, MgZnS, MgZnSe, CdZnSeS, CdZnSeTe, CdZnSTe, CdHgSeS, CdHgSeTe, CdHgSTe, HgZnSeS, HgZnSeTe, HgZnSTe, or any combination thereof.

In one or more embodiments, the quantum dot 111 may have a core-shell structure. The core may include CdSe, CdS, ZnS, ZnSe, CdTe, CdSeTe, CdZnS, PbSe, AgInZnS, ZnO, InN, InP, InAs, InSb, InGaP, or any combination thereof, and the shell may include CdSe, ZnSe, ZnS, ZnSeS, ZnTe, CdTe, PbS, TiO, SrSe, HgSe, or any combination thereof.

In one or more embodiments, the quantum dot 111 may have a core-shell structure including InP/ZnS or InP/ZnSeS.

The quantum dot 111 may be synthesized according to one or more suitable methods, such as a wet chemical process, a metal organic chemical vapor deposition (MOCVD) process, and/or a molecular beam epitaxy (MBE) process.

An average particle diameter of the quantum dot 111 may be from 1 nm to 20 nm, for example, from 1 nm to 15 nm, and for example, from 1 nm to 10 nm.

When the quantum dot 111 has a core-shell structure, a ratio of a radius of the core to a thickness of the shell may be from 2:8 to 8:2, for example, from 3:7 to 7:3, and for example, from 4:6 to 6:4.

The number of the quantum dot(s) 111 in the quantum dot-containing complex 110 may be from 50 to 2,000, for example, from 100 to 1,000. The number of the quantum dot(s) 111 in the quantum dot-containing complex 110 may be measured using a scanning electron microscope (SEM) or a transmission electron microscope (TEM).

A content (e.g., amount) of the quantum dot(s) 111 in the quantum dot-containing complex 110 may be from about 0.01 parts by weight to about 10 parts by weight, for example, from about 0.1 parts by weight to about 2 parts by weight, based on 100 parts by weight of the quantum dot-containing complex 110. When the content of the quantum dot(s) 111 in the quantum dot-containing complex 110 is within the range above, the quantum dot-containing material 1 may have excellent (or suitable) light conversion efficiency.

The refractive index of the first matrix material 113 may be greater than that of the second matrix material 130. Accordingly, light incident on the quantum dot-containing material 1 may enable multiple reflection in the quantum dot-containing complex 110. In this regard, the light absorption of the quantum dot 111 in the quantum dot-containing complex 110 may be increased, thereby increasing the light conversion efficiency of the quantum dot-containing material 1. Therefore, a separate scattering agent (e.g., an oxide-based scattering agent, such as $TiO_2$, and/or the like) to induce multiple reflection and/or scattering of light incident on the quantum dot-containing material 1 may not be used. Accordingly, the problem of poor quality of the quantum dot-containing material 1 due to poor particle dispersion caused by a difference between an average particle diameter of the quantum dot 111 and an average particle diameter of a conventional scattering agent may be substantially prevented.

In the specification, the term "refractive index" as used herein refers to an absolute refractive index with respect to a D-line of sodium (Na) ($\lambda$=589 nm, yellow color). For example, the refractive index may be an absolute refractive index measured based on a wavelength of 589 nm using a refractive index meter (e.g., ellipsometer, M-2000, J. A. Woollam) at a temperature of 25° C. and a relative humidity of 50%, for example, using the Cauchy equation (e.g., Cauchy Film Model).

The refractive index of each of the first matrix material 113 and the second matrix material 130 may be evaluated using a refractive index meter (e.g., ellipsometer, M-2000, J. A. Woollam) as follows: the refractive index of each of the first matrix material 113 and the second matrix material 130 in the quantum dot-containing material 1 may be measured, except for the quantum dot 111 therein; or the refractive index of each of a thin-film or particle consisting of the first matrix material 113 only without the quantum dot 111 and a thin-film or particle consisting of the second matrix material 130 without the quantum dot 111 may be measured.

The refractive index of the first matrix material 113 may be from 1.55 to 2.00, for example, from 1.55 to 1.85, and in one or more embodiments, may be from 1.580 to 1.802. The refractive index of the second matrix material 130 may be from 1.30 to 1.55, for example, from 1.40 to 1.50, and in one or more embodiments, may be 1.490. In one or more embodiments, the difference between the refractive index of the first matrix material 113 and the refractive index of the second matrix material 130 may be from 0.05 to 0.60, for example, from 0.06 to 0.45, and in one or more embodiments, from 0.090 to 0.312. By satisfying the above-described range, the multiple reflection of the light incident on the quantum dot-containing material 1 may be effectively induced, thereby increasing a light absorption rate of the quantum dot 111 of the quantum dot-containing complex 110. Accordingly, the light conversion efficiency of the quantum dot-containing material 1 may also be increased.

Each of the first matrix material 113 and the second matrix material 130 may include a material(s) capable of providing the refractive index described above.

The first matrix material 113 may include a first polymer which serves as a medium where the quantum dot 111 is dispersed.

The first polymer may be a polymer derived by polymerization (e.g., by solution polymerization) of the first monomer as described herein.

For example, the first monomer may include water-soluble vinyl-based monomer, a water-soluble acryl-based monomer, a water-soluble acrylamide-based monomer, or any combination thereof. The first monomer may be understood by referring to a description thereof provided below.

A content (e.g., amount) of the first polymer may be from about 70 parts by weight to about 100 parts by weight, for example, from about 80 parts by weight to about 100 parts by weight, based on 100 parts by weight of the first matrix material 113. When the content of the first polymer is within the range above, the first matrix material 113 may have excellent (or suitable) rigidity, and the quantum dot 111 may be relatively uniformly dispersed in the first matrix material 113.

The first matrix material 113 may further include, in addition to the first polymer, a polymerization initiator. The polymerization initiator may be any material capable of initiating the polymerization of the first monomer as described herein. For example, the polymerization initiator may be any polymerization initiator used in solution polymerization.

In one or more embodiments, the polymerization initiator may include potassium persulfate (KPS).

In one or more embodiments, to improve the degree of dispersion of the quantum dot 111, the first matrix material 113 may further include a dispersing agent and/or the like. The dispersing agent may be the same as described herein.

The second matrix material 130 may include a second polymer which serves as a medium where the quantum dot-containing complex 110 is dispersed.

The second polymer may be a polymer derived by polymerization (e.g., by photopolymerization) of the second monomer.

For example, the second monomer may include an acryl-based monomer. The second monomer may be understood by referring to a description thereof provided below.

A content (e.g., amount) of the second polymer may be from about 10 parts by weight to about 90 parts by weight, for example, about 20 parts by weight to about 80 parts by weight, based on 100 parts by weight of the second matrix material 130, When the amount of the second polymer is within the range above, the second matrix material 130 may have excellent (or suitable) rigidity, and the quantum dot-containing complex 110 may be relatively uniformly dispersed in the second matrix material 130.

The second matrix material 130 may further include, in addition to the second polymer, a polymerization initiator. The polymerization initiator may be any material capable of initiating the polymerization of the second monomer. For example, the polymerization initiator may be any suitable photopolymerization initiator used in photopolymerization. The photopolymerization initiator may be understood by referring to a description thereof provided below.

The second matrix material 130 may further include, in addition to the second polymer and the polymerization initiator, an alkali-soluble resin, a dispersing agent, an additive, or any combination thereof. The alkali-soluble resin, the dispersing agent, and the additive may be understood by referring to descriptions thereof provided below.

The quantum dot-containing complex 110 may be a spherical particle. For example, the quantum dot-containing complex 110 may be a spherical particle, and a surface thereof may be smooth. When the quantum dot-containing complex 110 is a spherical particle, the quantum dot-containing complex 110 may be prepared by a separate process, and then, may be mixed with a mixture for forming the second matrix material 130 as a spherical form (i.e., a bead or powder form in which a solvent and/or the like is removed). Thus, in the quantum dot-containing material 1, a boundary between the quantum dot-containing complex 110 and the second matrix material 130 may be clearly distinguished.

As such, the "quantum dot-containing complex 110" and the "second matrix material 130" are clearly distinguished from a comparable "quantum dot-containing region" and a "quantum dot-non-containing region", wherein the "quantum dot-containing region" and the "quantum dot-non-containing region" are induced by mixing a quantum dot-containing solution and a polymeric solution which are then being partially phase separated due to the polarity difference between the quantum dot-containing solution and the polymeric solution. When the "quantum dot-containing region" and the "quantum dot-non-containing region" are induced by phase separation, a boundary therebetween may be unclear. In addition, the "quantum dot-containing region" may be irregular in appearance, have a surface that is not smooth, and have a very high uniformity coefficient. Thus, a comparable quantum dot-containing material including the "quantum dot-containing region" and the "quantum dot-non-containing region" that are induced by phase separation as described above may have poor light conversion efficiency.

An average particle diameter (D50) of the quantum dot-containing complex 110 may be from about 40 nm to 1,000 nm, for example, from about 50 nm to about 1,000 nm, or from about 100 nm to about 500 nm, and in one or more embodiments, may be from about 100 nm to about 200 nm. When the average particle diameter D50 of the quantum dot-containing complex 110 is within the range above, the quantum dot-containing complex 110, which includes a relatively large quantity of the quantum dots 111, may be dispersed with excellent (or suitable) degree of dispersion in the second matrix material 130.

The uniformity coefficient (D60/D10) of the quantum dot-containing complex 110 may be from about 1.0 to about 2.0, for example, from about 1.4 to about 1.8. When the uniformity coefficient of the quantum dot-containing complex 110 is within any of the ranges above, the average particle diameter of the quantum dot-containing complex 110 may result in a high degree of uniformity, and accordingly, the quantum dot-containing complex 110 may be dispersed with an excellent (or suitable) degree of dispersion in the second matrix material 130.

The average particle diameter D50 may be measured by measuring a particle size distribution curve of the quantum dot-containing complex 110 by using a particle size analyzer, and then, by measuring a particle diameter corresponding to 50% in terms of a passage mass percentage.

The uniformity coefficient D60/D10 may be measured by evaluating a particle size distribution curve of the quantum dot-containing complex 110 by using a particle size analyzer, and then, by evaluating a ratio of D60 (i.e., a particle diameter corresponding to 60% in terms of a passage mass percentage) to D10 (i.e., a particle diameter corresponding to 10% in terms of a passage mass percentage).

The quantum dot-containing material 1 may have an irregular shape filling a set or predetermined space, or may have a thin-film form. When the quantum dot-containing material 1 has a thin-film form, the "quantum dot-containing material 1" may be referred to as a "quantum dot-containing thin-film 1". Here, a thickness of the thin-film may be from about 0.1 μm to about 100 μm, for example, about 1 μm to about 10 μm.

Another embodiment of the present disclosure provides a method of preparing the quantum dot-containing material 1, the method including:

preparing a first composition including a quantum dot 111, a first monomer, a polymerization initiator, and a solvent;

preparing a second composition by converting the first monomer in the first composition into at least a part of a first matrix material 113, the second composition including a quantum dot-containing complex 110 and the solvent, the quantum dot-containing complex 110 comprising the quantum dot 111 and the first matrix material 113 in which the quantum dot 111 is dispersed;

obtaining the quantum dot-containing complex 110 by removing the solvent from the second composition;

preparing a third composition including the quantum dot-containing complex 110, a second monomer, a polymerization initiator, and a solvent; and preparing a quantum dot-containing material 1 by converting the second monomer in the third composition into at least a part of a second matrix material 130, the quantum dot-containing material 1 comprising the quantum dot-containing complex 110 and the second matrix material 130, in which the quantum dot-containing complex 110 is dispersed.

Here, a refractive index of the first matrix material 113 may be, as described above, greater than that of the second matrix material 130.

Hereinafter, the method of preparing the quantum dot-containing material 1 may will be described in more detail below.

First, a first composition including a quantum dot 111, a first monomer, a polymerization initiator, and a solvent is prepared.

The quantum dot 111 in the first composition is the same as described herein.

A content (e.g., amount) of the quantum dot 111 may be from about 0.1 parts by weight to about 10 parts by weight, for example, from about 0.1 parts by weight to about 5 parts by weight, based on 100 parts by weight of the first composition. When the content of the quantum dot 111 is within the range above, the quantum dot-containing material 1 having excellent (or suitable) light conversion efficiency may be prepared.

The first monomer in the first composition may be a monomer(s) polymerizable by solution polymerization.

For example, the first monomer in the first composition may include a vinyl-based monomer, an acryl-based monomer, an acrylamide-based monomer, or any combination thereof.

in one or more embodiments, the first monomer in the first composition may include a water-soluble vinyl-based monomer, a water-soluble acryl-based monomer, a water-soluble acrylamide-based monomer, or any combination thereof.

In one or more embodiments, the first monomer may be a group represented by one of Formulae 1-1 to 1-3:

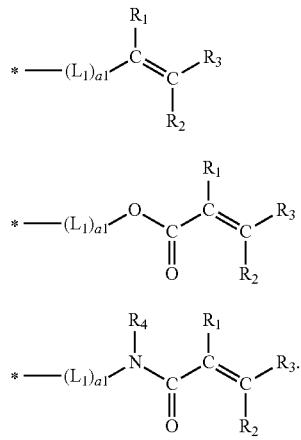

In Formulae 1-1 to 1-3, $L_1$ may be a single bond, $C(R_5)(R_6)$, $N(R_5)$, O, or S, a1 may be an integer from 1 to 10, and when a1 is 2 or more, two or more $L_1(s)$ may be identical to or different from each other, $R_1$ to $R_6$ may each independently be hydrogen, deuterium, a $C_1$-$C_{20}$ alkyl group, a phenyl group, or a biphenyl group, and

* indicates a binding site to a neighboring atom.

In one or more embodiments, the first monomer may include a ring-type (e.g., ring-containing) vinyl-based monomer, a ring-type (e.g., ring-containing) acryl-based monomer, a ring-type (e.g., ring-containing) acrylamide-based monomer, or any combination thereof. The ring-type vinyl-based monomer, the ring-type acryl-based monomer, and the ring-type acrylamide-based monomer may each independently be a compound having 1) at least one substituted or unsubstituted $C_5$-$C_{60}$ carbocyclic group, at least one substituted or unsubstituted $C_1$-$C_{60}$ heterocyclic group, or any combination thereof, and 2) a vinyl-based group (e.g., a group represented by Formula 1-1), an acrylate-based group (e.g., a group represented by Formula 1-2), an acrylamide-based group (e.g., a group represented by Formula 1-3), or any combination thereof.

For example, the ring-type vinyl-based monomer may be understood by referring to Compounds 1 and 11 below, the ring-type acryl-based monomer may be understood by referring to Compounds 2 to 8, 10, and 101 to 107 below, and the ring-type acrylamide-based monomer may be understood by referring to Compound 9 below.

In one or more embodiments, the first monomer may be a compound represented by Formula 1:

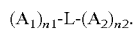   Formula 1

In Formula 1, $A_1$ may be a group represented by one of Formulae 2-1 to 2-9, a group derived from a hole transport material in an organic layer of an organic light-emitting device, a group derived from a light-emitting material in an organic layer of an organic light-emitting device, or a group derived from an electron transport material in an organic layer of an organic light-emitting device, L may be a single bond, a double bond, O, or S, $A_2$ may be a vinyl-based group (e.g., a group represented by Formula 1-1), an acrylate-based group (e.g., a group represented by Formula 1-2), or an acrylamide-based group (e.g., a group represented by Formula 1-3), and n1 and n2 may each independently be an integer from 1 to 10, wherein, when n1 is 2 or more, two or more $A_1(s)$ may be identical to or different from each other, and when n2 is 2 or more, two or more $A_2(s)$ may be identical to or different from each other:

2-1

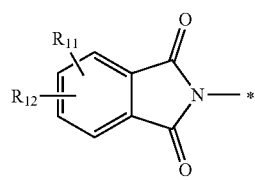

2-2

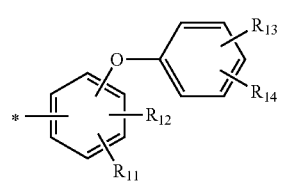

2-3

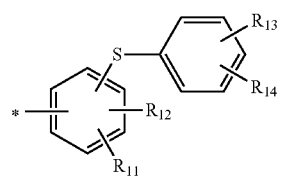

2-4

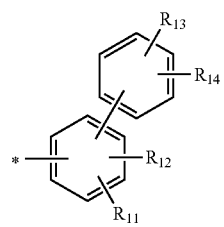

2-5

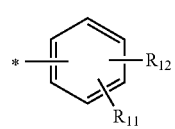

2-6

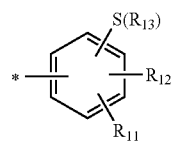

2-7

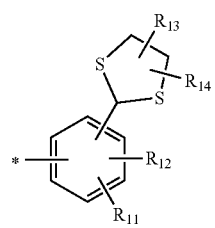

-continued 2-8

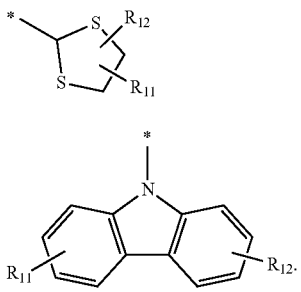

2-9

In Formulae 2-1 to 2-9, $R_{11}$ to $R_{14}$ may each independently be hydrogen, deuterium, —F, —Cl, —Br, —I, a hydroxyl group, a cyano group, a nitro group, a substituted or unsubstituted $C_1$-$C_{60}$ alkyl group, a substituted or unsubstituted $C_2$-$C_{60}$ alkenyl group, a substituted or unsubstituted $C_2$-$C_{60}$ alkynyl group, a substituted or unsubstituted $C_1$-$C_{60}$ alkoxy group, a substituted or unsubstituted $C_3$-$C_{10}$ cycloalkyl group, a substituted or unsubstituted $C_1$-$C_{10}$ heterocycloalkyl group, a substituted or unsubstituted $C_3$-$C_{10}$ cycloalkenyl group, a substituted or unsubstituted $C_1$-$C_{10}$ heterocycloalkenyl group, a substituted or unsubstituted $C_6$-$C_{60}$ aryl group, a substituted or unsubstituted $C_6$-$C_{60}$ aryloxy group, a substituted or unsubstituted $C_6$-$C_{60}$ arylthio group, a substituted or unsubstituted $C_1$-$C_{60}$ heteroaryl group, a substituted or unsubstituted monovalent non-aromatic condensed polycyclic group or a substituted or unsubstituted monovalent non-aromatic condensed heteropolycyclic group, and

* indicates a binding site to L or $A_2$ in Formula 1.

In the present specification, the term "group derived from a hole transport material" as used herein refers to a monovalent group where any atom of the hole transport material is radicalized and becomes a binding site capable of chemically binding to L or $A_2$ in Formula 1. In the present specification, the terms "group derived from a light-emitting material" and "group derived from an electron-transport material" as used herein may also be interpreted in the same sense.

Examples of each of the hole transport material in the "group derived from the hole transport material", the light-emitting material in the "group derived from the light-emitting material", and the electron transport material in the "group derived from the electron transport material" are as follows:

Examples of Hole Transport Material

The hole transport material may be a compound represented by Formula 201 or a compound represented by Formula 202:

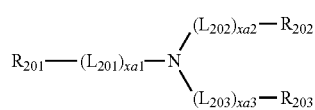

Formula 201

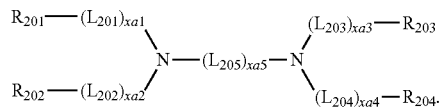

Formula 202

In Formulae 201 and 202, $L_{201}$ to $L_{204}$ may each independently be a substituted or unsubstituted $C_3$-$C_{10}$ cycloalkylene group, a substituted or unsubstituted $C_1$-$C_{10}$ heterocycloalkylene group, a substituted or unsubstituted $C_3$-$C_{10}$ cycloalkenylene group, a substituted or unsubstituted $C_1$-$C_{10}$ heterocycloalkenylene group, a substituted or unsubstituted $C_6$-$C_{60}$ arylene group, a substituted or unsubstituted $C_1$-$C_{60}$ heteroarylene group, a substituted or unsubstituted divalent non-aromatic condensed polycyclic group, or a substituted or unsubstituted divalent non-aromatic condensed heteropolycyclic group, $L_{205}$ may be *—O—*', *—S—*', *—N($Q_{201}$)—*', a substituted or unsubstituted $C_1$-$C_{20}$ alkylene group, a substituted or unsubstituted $C_2$-$C_{20}$ alkenylene group, a substituted or unsubstituted $C_3$-$C_{10}$ cycloalkylene group, a substituted or unsubstituted $C_1$-$C_{10}$ heterocycloalkylene group, a substituted or unsubstituted $C_3$-$C_{10}$ cycloalkenylene group, a substituted or unsubstituted $C_1$-$C_{10}$ heterocycloalkenylene group, a substituted or unsubstituted $C_6$-$C_{60}$ arylene group, a substituted or unsubstituted $C_1$-$C_{60}$ heteroarylene group, a substituted or unsubstituted divalent non-aromatic condensed polycyclic group, or a substituted or unsubstituted divalent non-aromatic condensed heteropolycyclic group, xa1 to xa4 may each independently be 0, 1, 2, or 3 (for example, 0, 1, or 2), xa5 may be an integer from 1 to 10 (for example, 1, 2, 3, or 4), and $R_{201}$ to $R_{204}$ and $Q_{201}$ may each independently be a substituted or unsubstituted $C_3$-$C_{10}$ cycloalkyl group, a substituted or unsubstituted $C_1$-$C_{10}$ heterocycloalkyl group, a substituted or unsubstituted $C_3$-$C_{10}$ cycloalkenyl group, a substituted or unsubstituted $C_1$-$C_{10}$ heterocycloalkenyl group, a substituted or unsubstituted $C_6$-$C_{60}$ aryl group, a substituted or unsubstituted $C_6$-$C_{60}$ aryloxy group, a substituted or unsubstituted $C_6$-$C_{60}$ arylthio group, a substituted or unsubstituted $C_1$-$C_{60}$ heteroaryl group, a substituted or unsubstituted monovalent non-aromatic condensed polycyclic group, or a substituted or unsubstituted monovalent non-aromatic condensed heteropolycyclic group.

For example, in Formula 202, $R_{201}$ and $R_{202}$ may optionally be linked to each other via a single bond, a dimethyl-methylene group, or a diphenyl-methylene group, and $R_{203}$ and $R_{204}$ may optionally be linked to each other via a single bond, a dimethyl-methylene group, or a diphenyl-methylene group.

In one or more embodiments, the hole transport material may be one of Compounds HT1 to HT44 below, m-MT-DATA, TDATA, 2-TNATA, NPB(NPD), β-NPB, TPD, spiro-TPD, spiro-NPB, methylated-NPB, TAPC, HMTPD, or 4,4',4"-tris(N-carbazolyl)triphenylamine (TCTA):

13 14
HT1
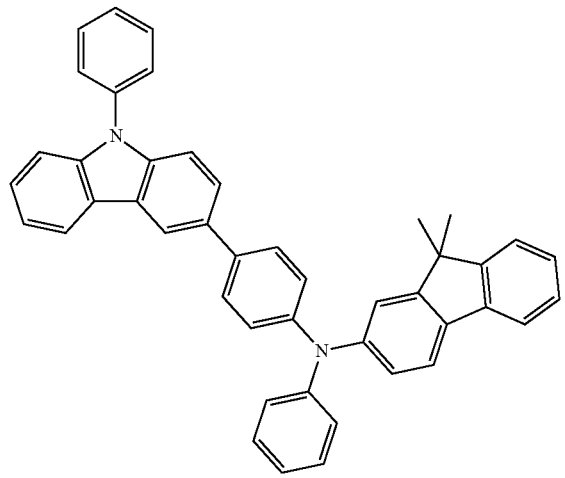
HT2
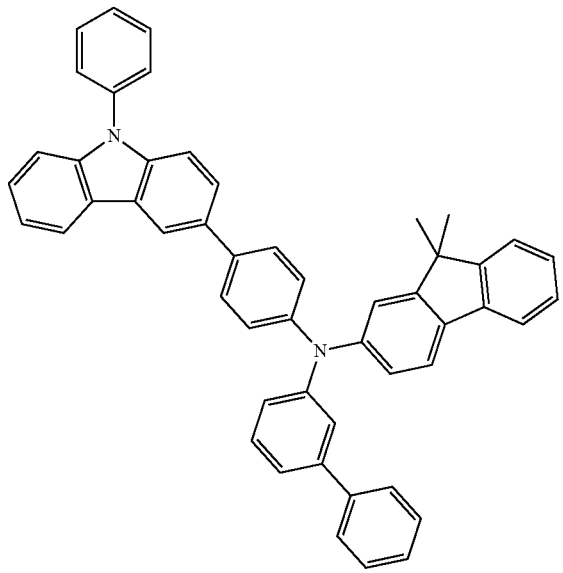
HT3
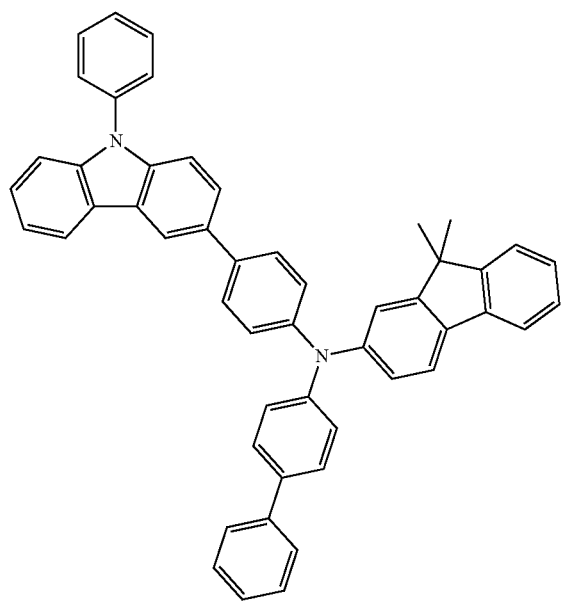
HT4
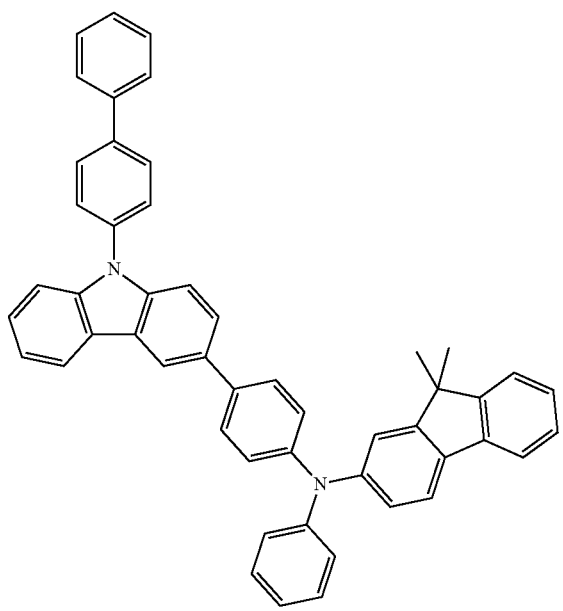

-continued
HT5 HT6
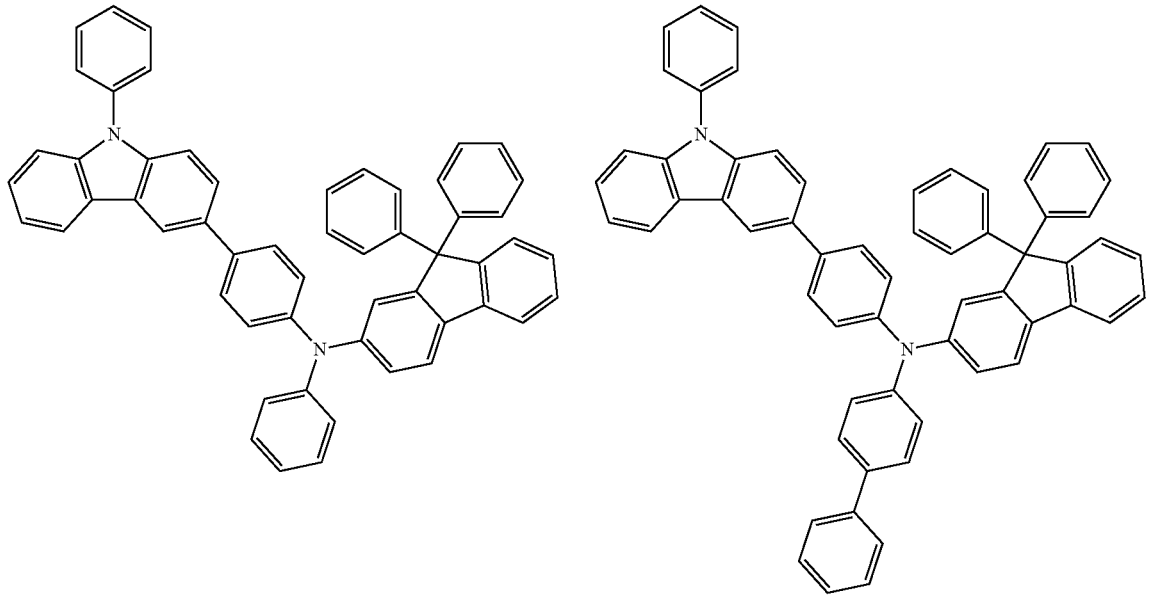
HT7 HT8
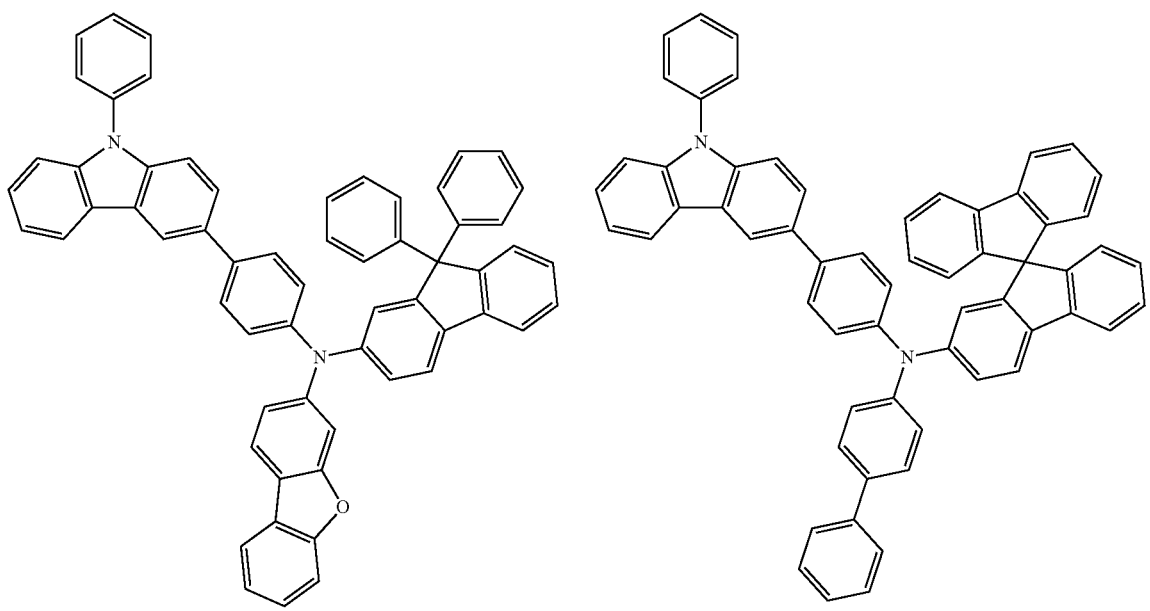

HT9
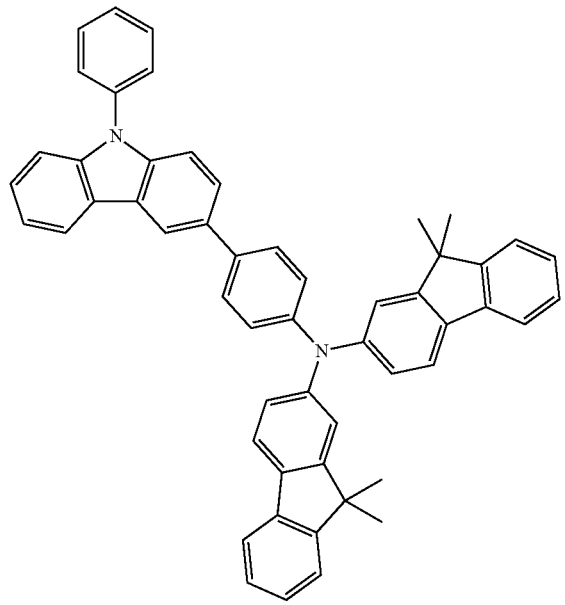
HT10
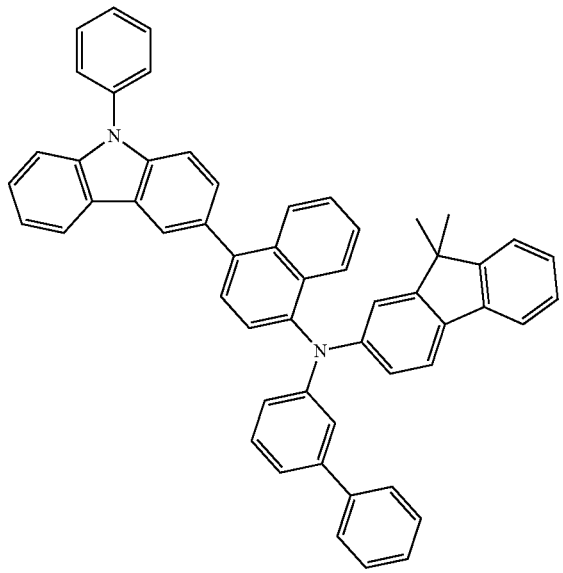
HT11
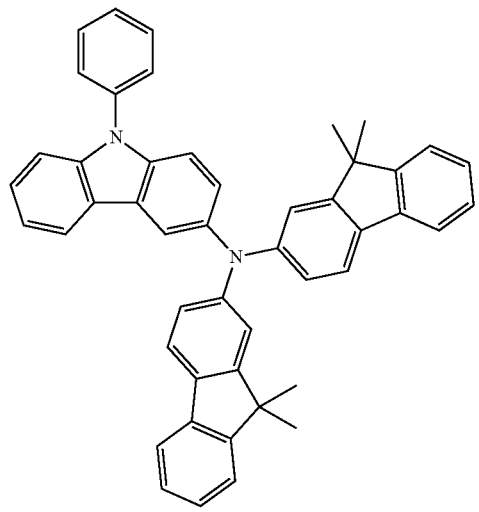
HT12
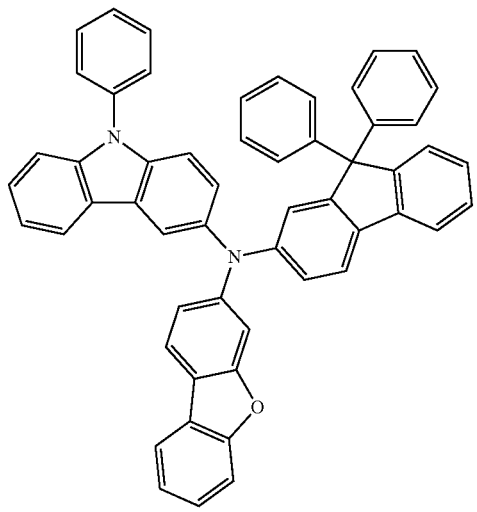

-continued
HT13
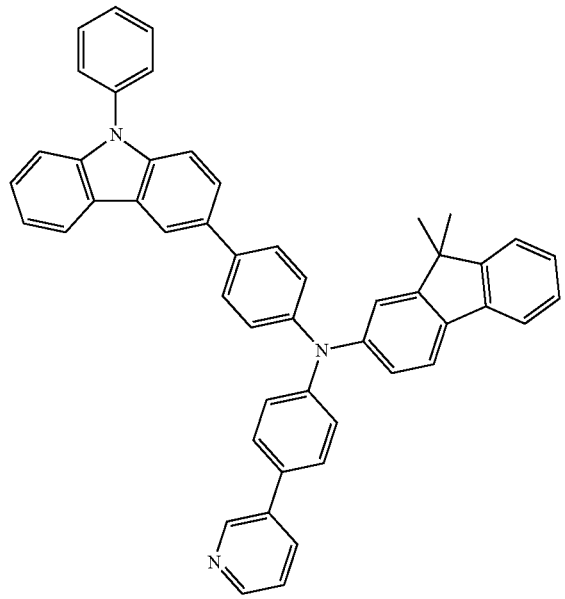
HT14
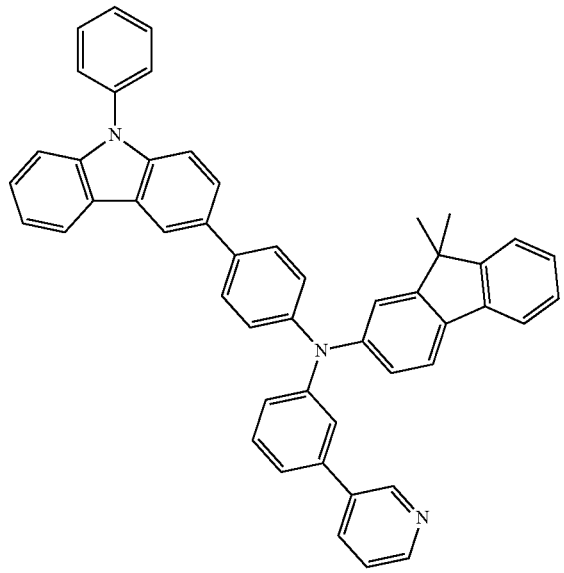
HT15
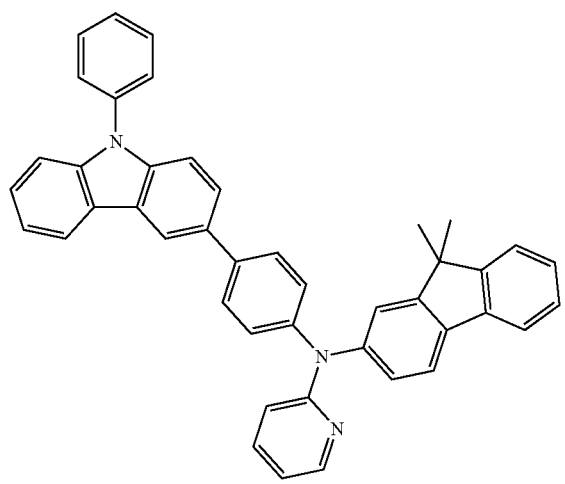
HT16
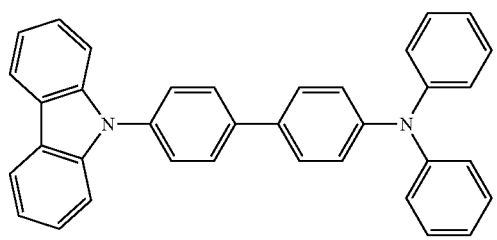
HT17
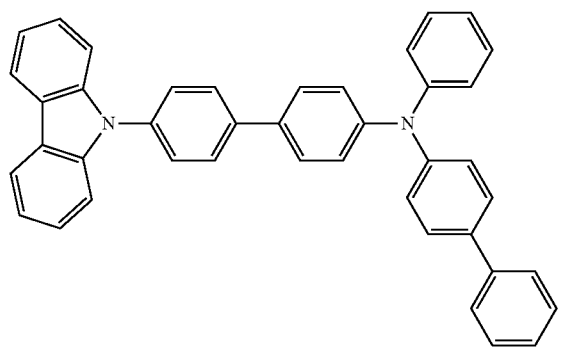
HT18
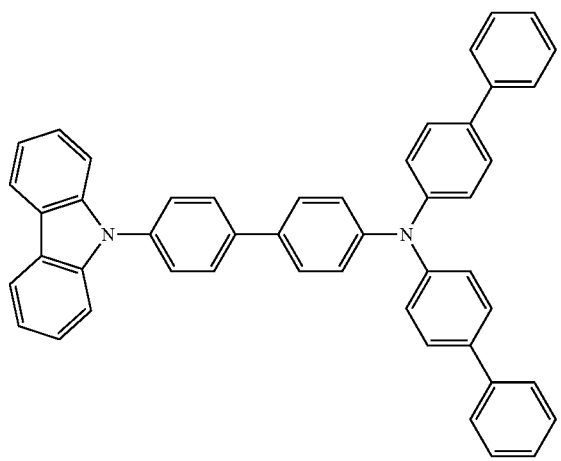

-continued
HT19
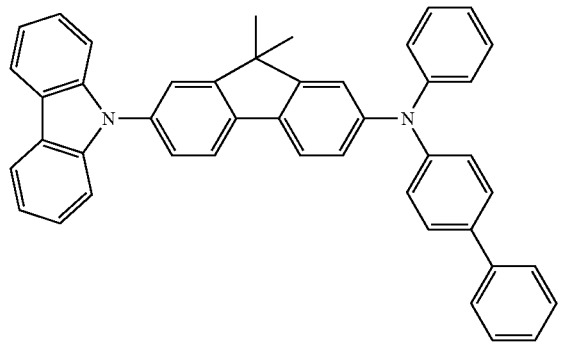
HT20
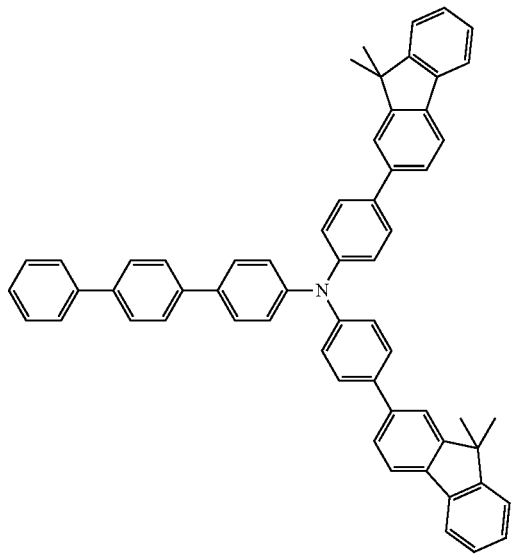
HT21
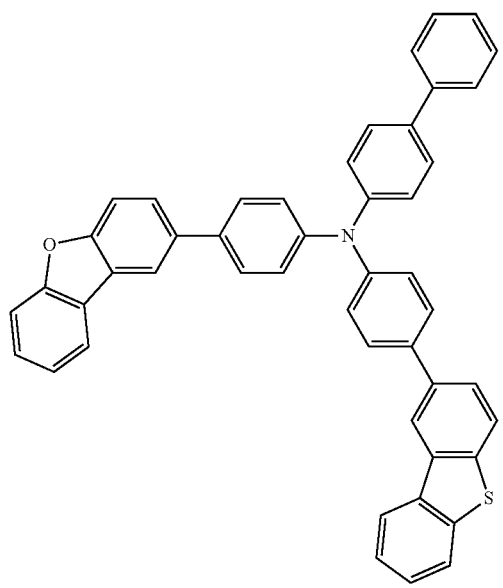
HT22
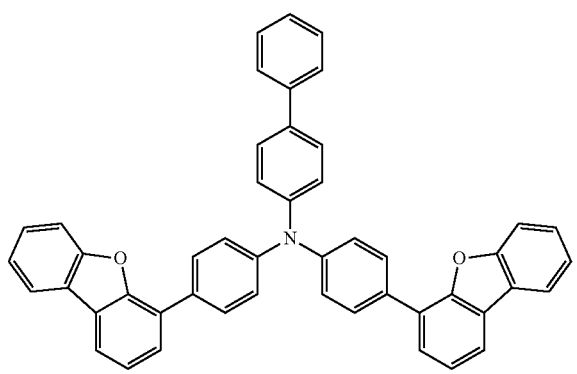
HT23
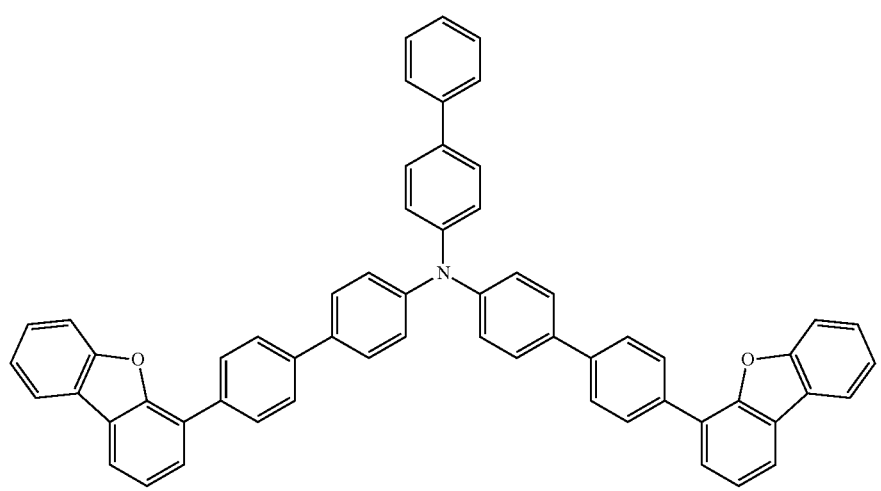

-continued
HT24
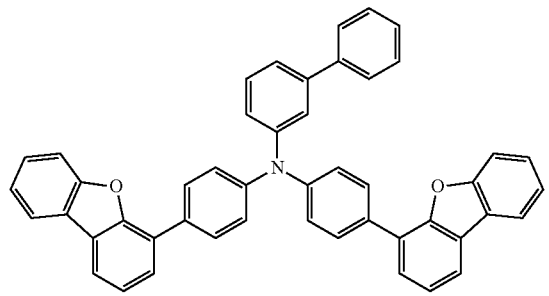
HT25
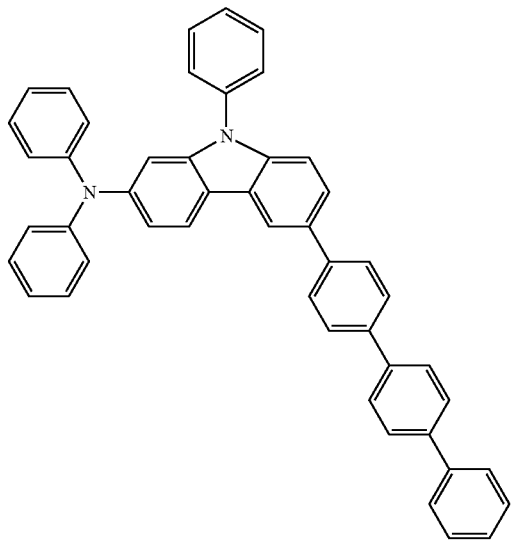
HT26
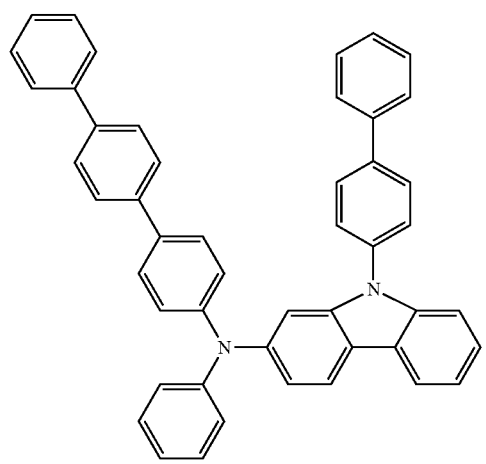
HT27
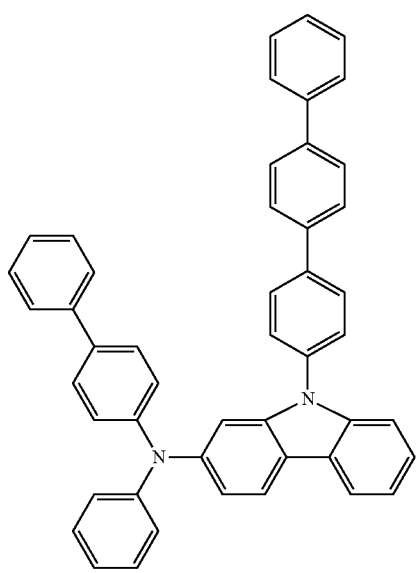
HT28
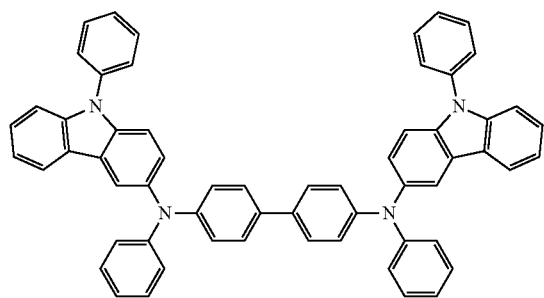
HT29
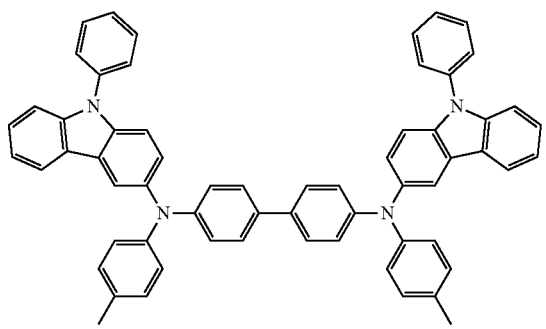

-continued
HT30
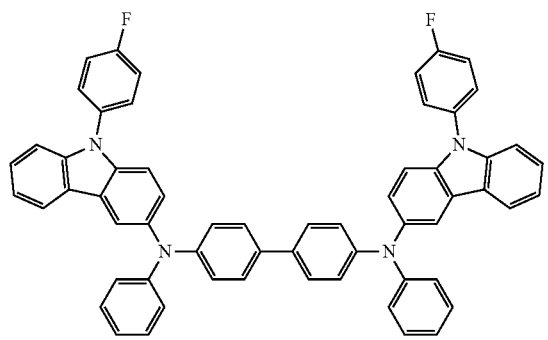
HT31
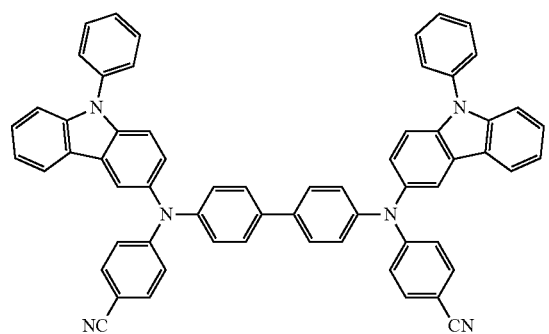
HT32
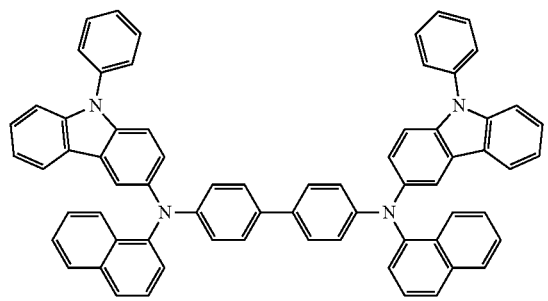
HT33
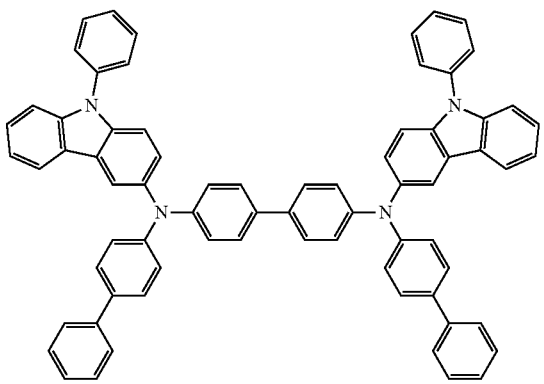
HT34
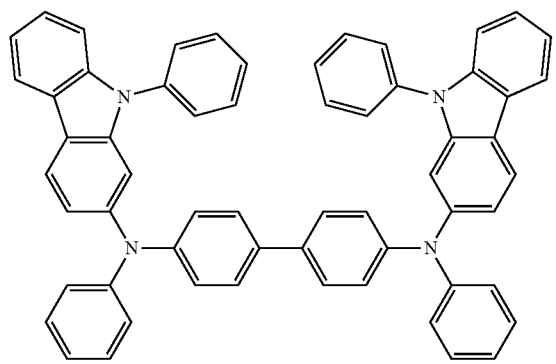
HT35
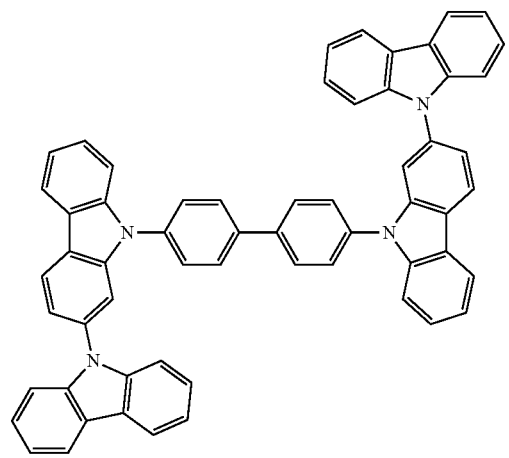

-continued
HT36
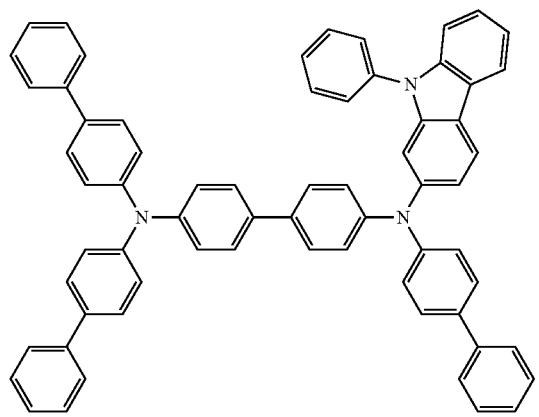
HT37
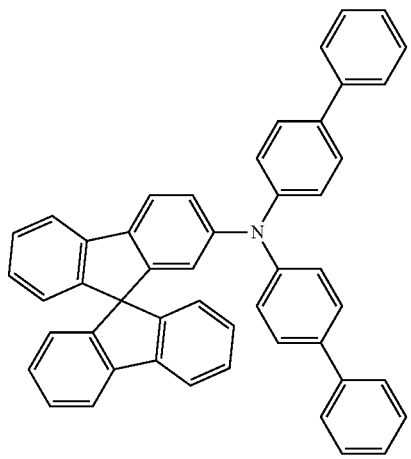
HT38
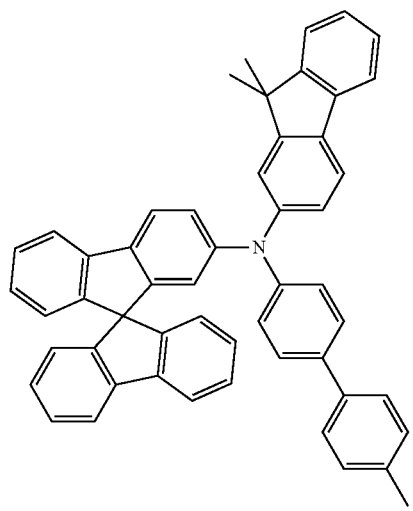
HT39
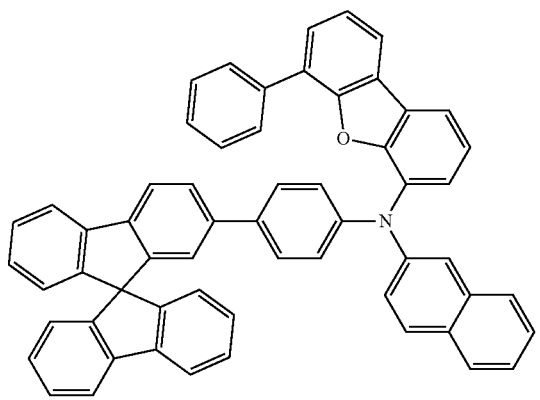
HT40
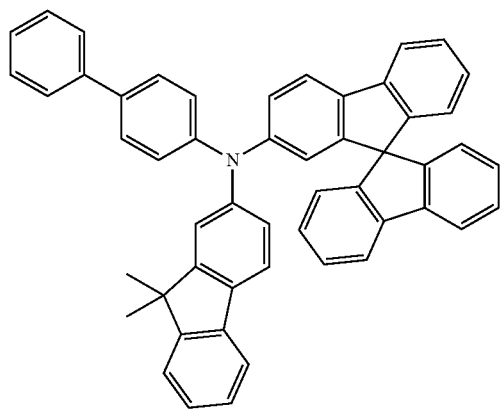
HT41
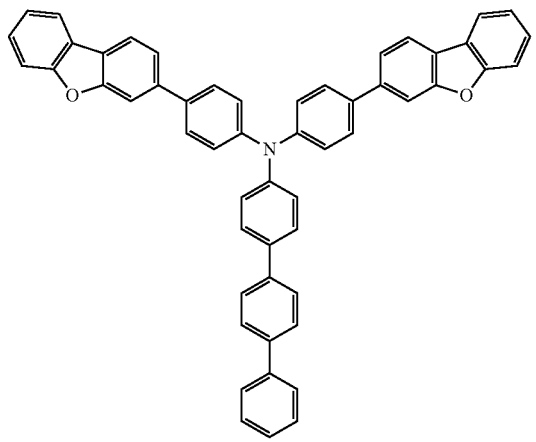

-continued
HT42
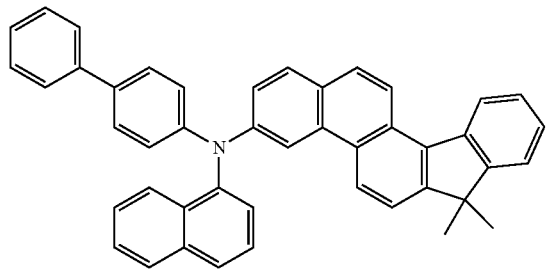
HT43
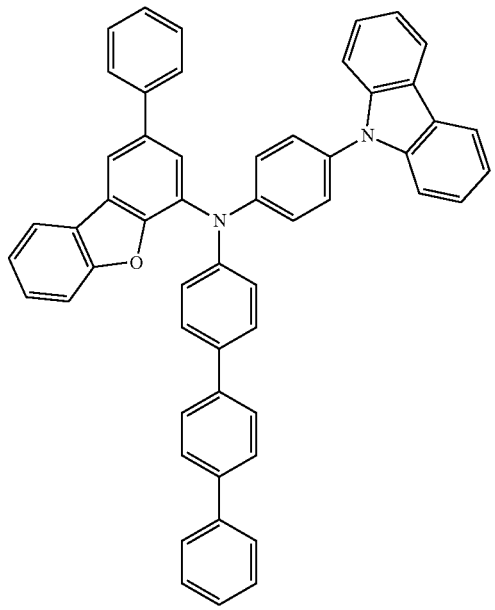
HT44
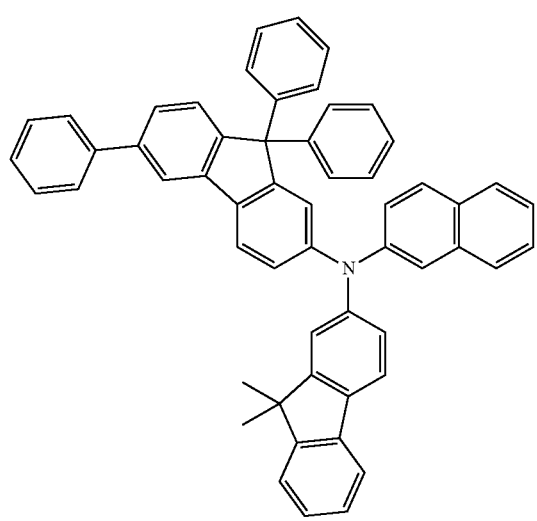

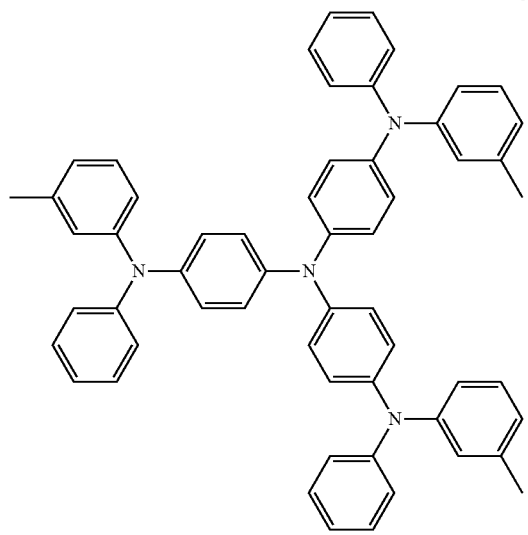
m-MTDATA
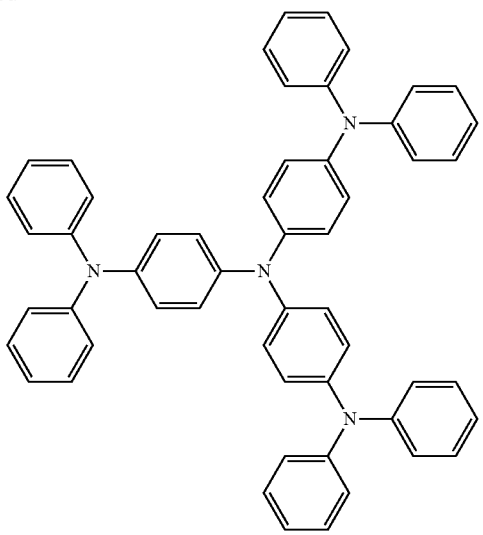
TDATA
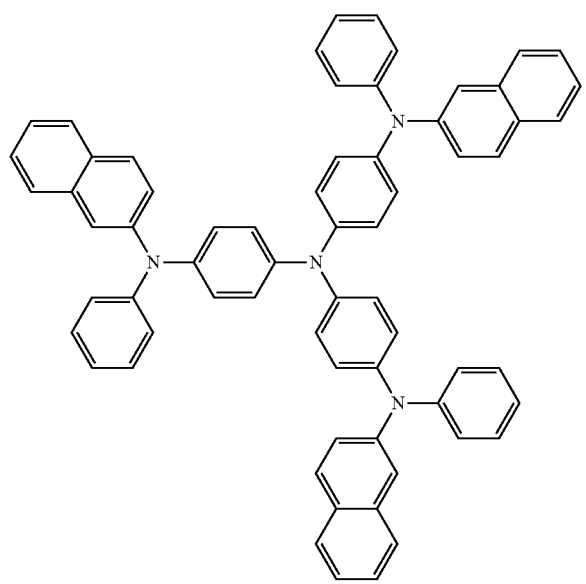
2-TNATA
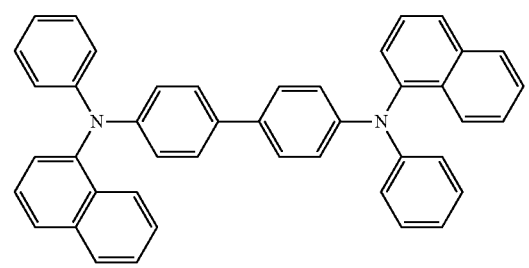
NPB
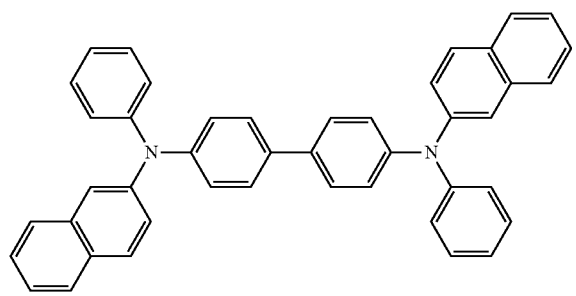
β-NPB
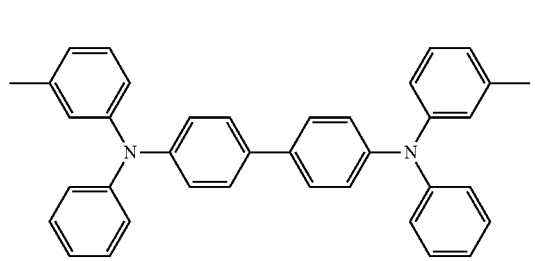
TPD

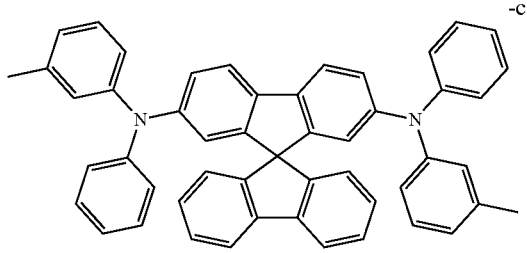

Spiro-TPD

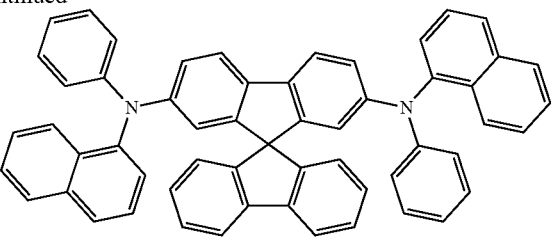

Spiro-NPB

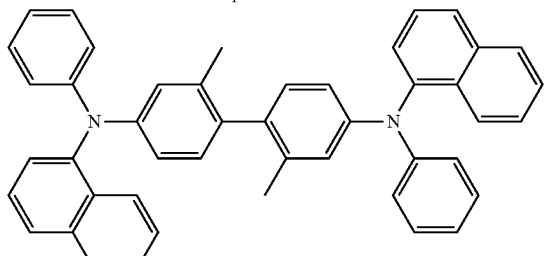

methylated-NPB

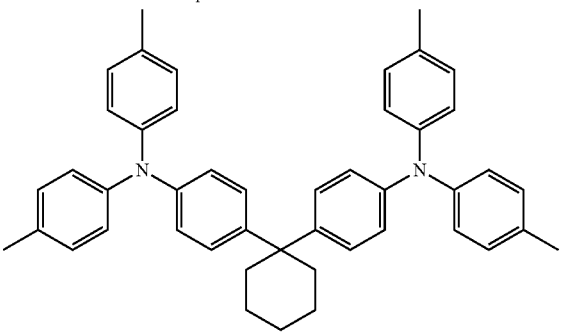

TAPC

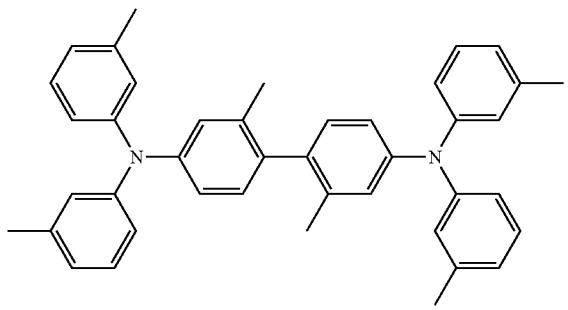

HMTPD

Examples of Light-Emitting Material

The light-emitting material may be a compound represented by Formula 301 below:

$$[Ar_{301}]_{xb11}-[(L_{301})_{xb1}-R_{301}]_{xb21}. \quad \text{Formula 301}$$

In Formula 301, $Ar_{301}$ may be a substituted or unsubstituted $C_5$-$C_{60}$ carbocyclic group or a substituted or unsubstituted $C_1$-$C_{60}$ heterocyclic group, xb11 may be 1, 2, or 3, $L_{301}$ may be a substituted or unsubstituted $C_3$-$C_{10}$ cycloalkylene group, a substituted or unsubstituted $C_1$-$C_{10}$ heterocycloalkylene group, a substituted or unsubstituted $C_3$-$C_{10}$ cycloalkenylene group, a substituted or unsubstituted $C_1$-$C_{10}$ heterocycloalkenylene group, a substituted or unsubstituted $C_6$-$C_{60}$ arylene group, a substituted or unsubstituted $C_1$-$C_{60}$ heteroarylene group, a substituted or unsubstituted divalent non-aromatic condensed polycyclic group, a substituted or unsubstituted divalent non-aromatic condensed heteropolycyclic group, xb1 may be 0, 1, 2, 3, 4, or 5, $R_{301}$ may be deuterium, —F, —Cl, —Br, —I, a hydroxyl group, a cyano group, a nitro group, a substituted or unsubstituted $C_1$-$C_{60}$ alkyl group, a substituted or unsubstituted $C_2$-$C_{60}$ alkenyl group, a substituted or unsubstituted $C_2$-$C_{60}$ alkynyl group, a substituted or unsubstituted $C_1$-$C_{60}$ alkoxy group, a substituted or unsubstituted $C_3$-$C_{10}$ cycloalkyl group, a substituted or unsubstituted $C_1$-$C_{10}$ heterocycloalkyl group, a substituted or unsubstituted $C_3$-$C_{10}$ cycloalkenyl group, a substituted or unsubstituted $C_1$-$C_{10}$ heterocycloalkenyl group, a substituted or unsubstituted $C_6$-$C_{60}$ aryl group, a substituted or unsubstituted $C_6$-$C_{60}$ aryloxy group, a substituted or unsubstituted $C_6$-$C_{60}$ arylthio group, a substituted or unsubstituted $C_1$-$C_{60}$ heteroaryl group, a substituted or unsubstituted monovalent non-aromatic condensed polycyclic group, a substituted or unsubstituted monovalent non-aromatic condensed heteropolycyclic group, —Si($Q_{301}$)($Q_{302}$)($Q_{303}$), —N($Q_{301}$)($Q_{302}$), —B($Q_{301}$)($Q_{302}$), —C(=O)($Q_{301}$), —S(=O)$_2$($Q_{301}$), or —P(=O)($Q_{301}$)($Q_{302}$), xb21 may be 1, 2, 3, 4, or 5, and $Q_{301}$ to $Q_{303}$ may each independently be defined the same as described in connection with $Q_1$.

For example, when xb11 in Formula 301 is 2 or more, two or more $Ar_{301}$(s) may be linked to each other via a single bond.

In one or more embodiments, the light-emitting material may be one of Compounds H1 to H36 below, 9,10-di(2- naphthyl)anthracene (ADN), 2-Methyl-9,10-bis(naphthalen-2-yl)anthracene (MADN), 9,10-di-(2-naphthyl)-2-t-butyl-anthracene (TBADN), 4,4'-bis(N-carbazolyl)-1,1'-biphenyl (CBP), 1,3-di-9-carbazolylbenzene (mCP), or 1,3,5-tri(carbazol-9-yl)benzene (TCP):
H1
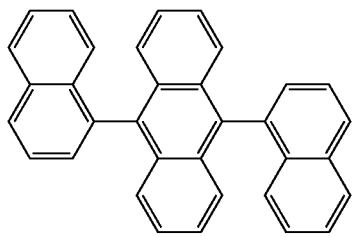
H2
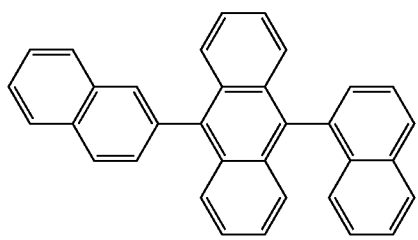
H3
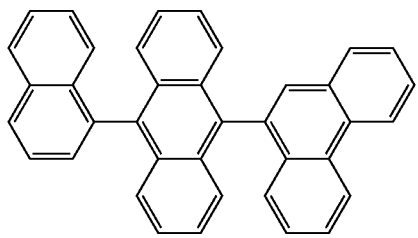
H4
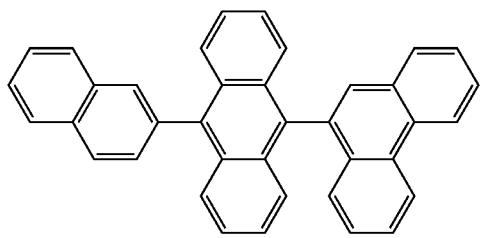
H5
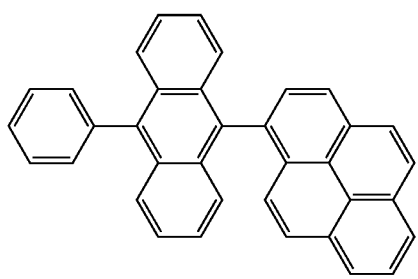
-continued
H6
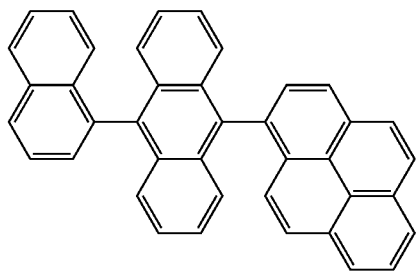
H7
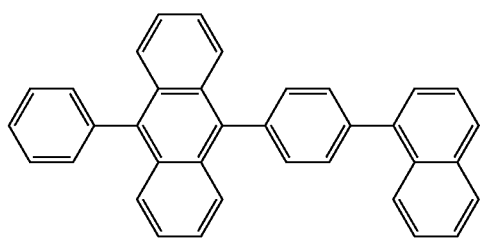
H8
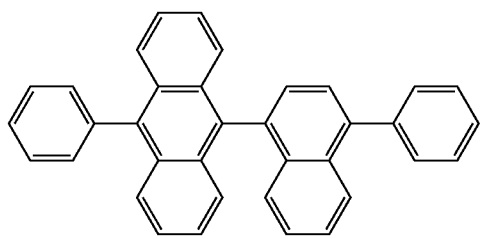
H9
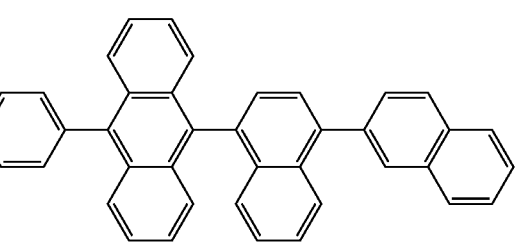
H10
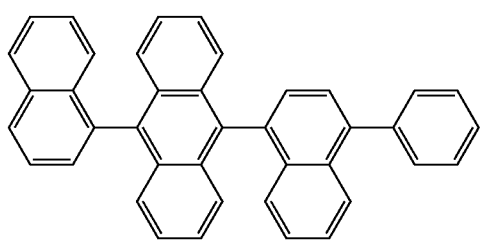
H11
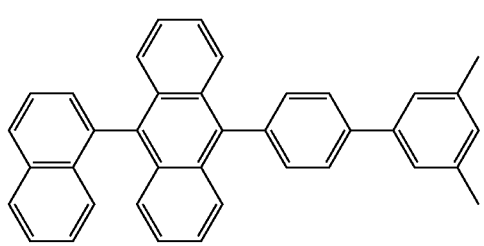

H12
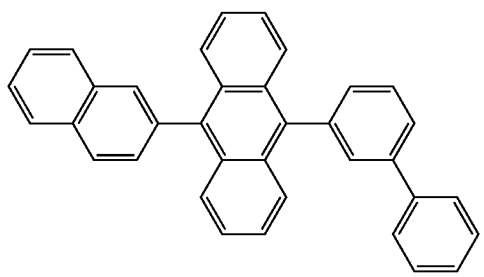
H13
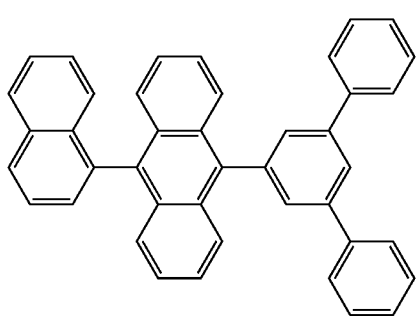
H14
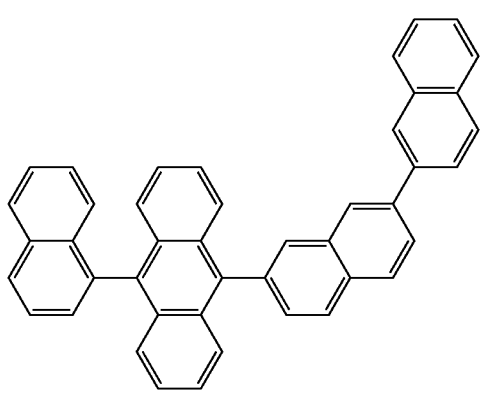
H15
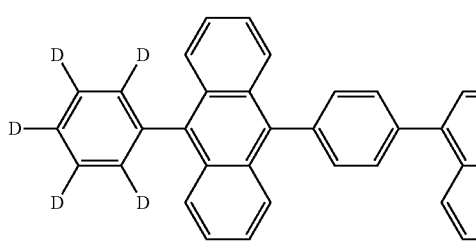
H16
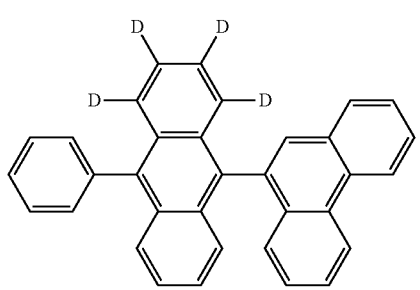
H17
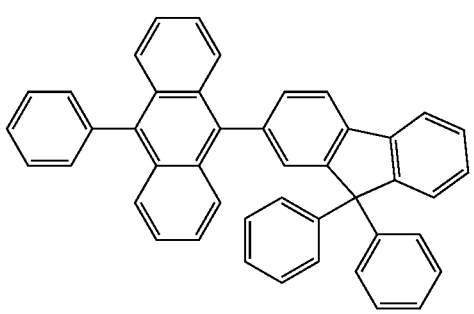
H18
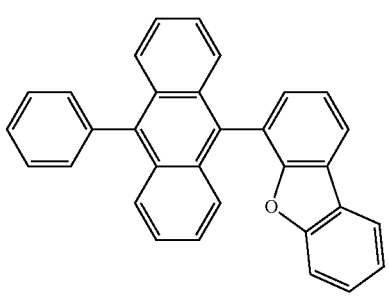
H19
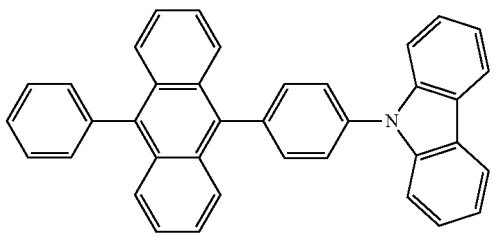
H20
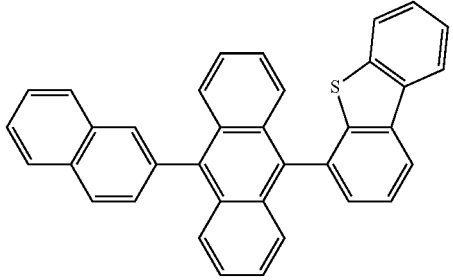
H21
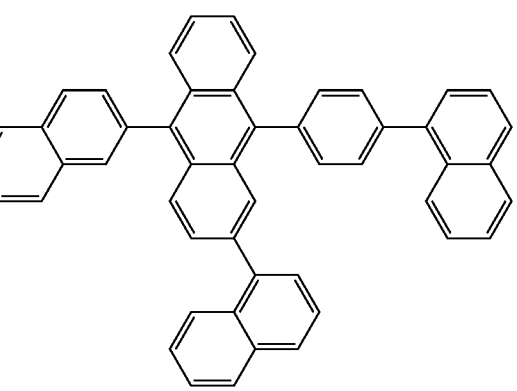

H22
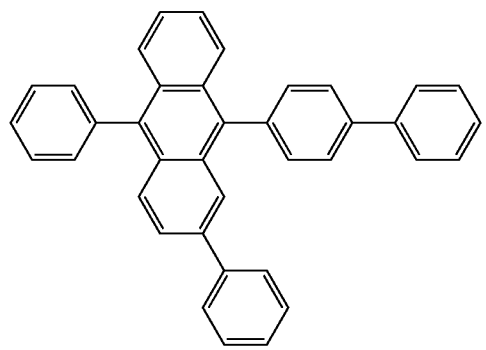
H23
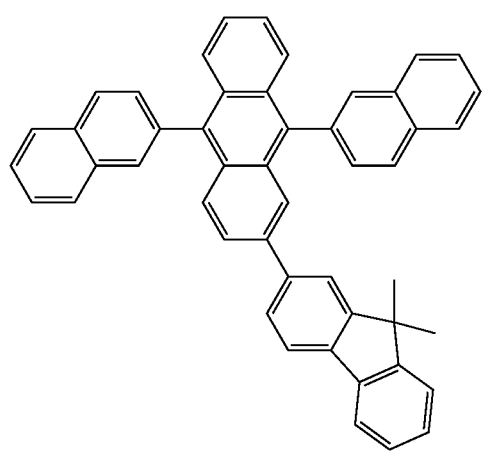
H24
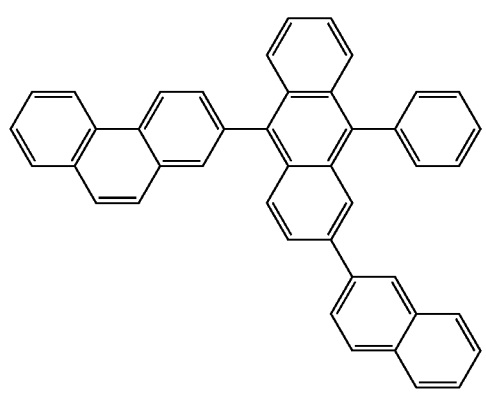
H25
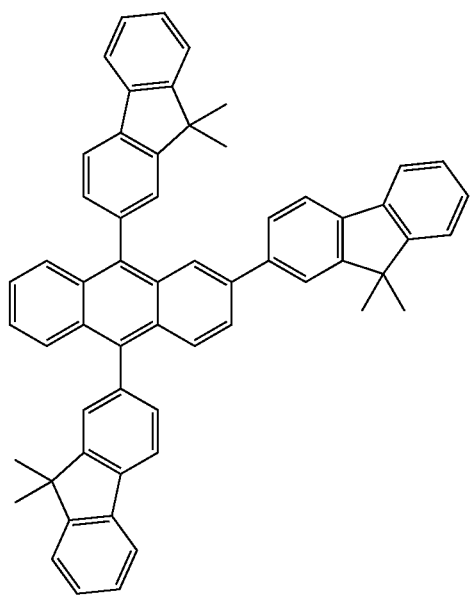
H26
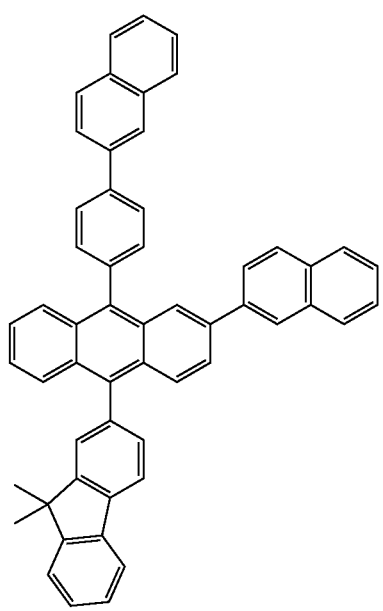

-continued
H27
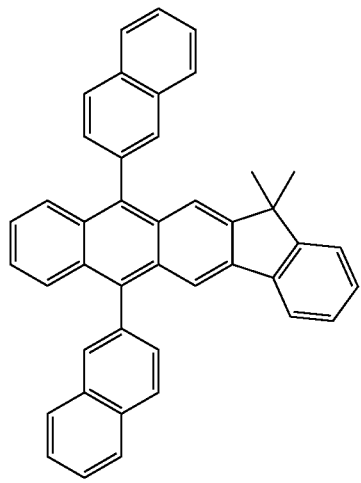
H28
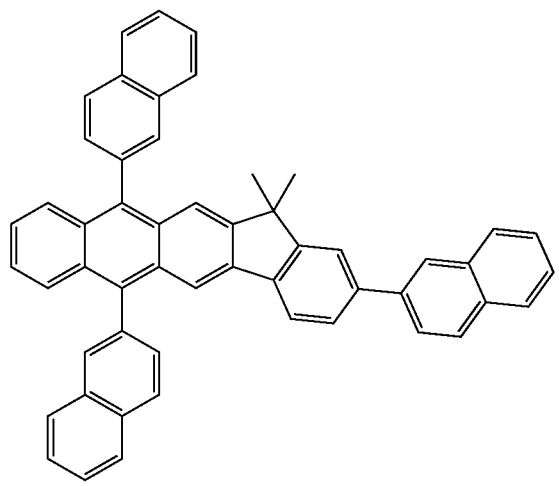
H29
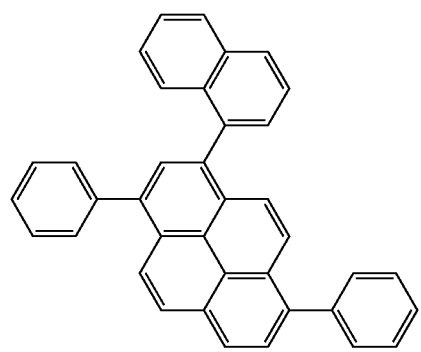
-continued
H30
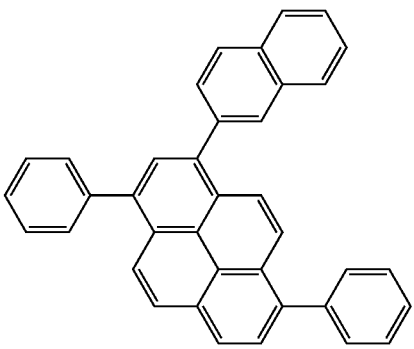
H31
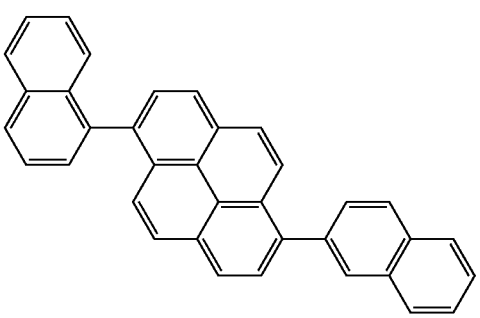
H32
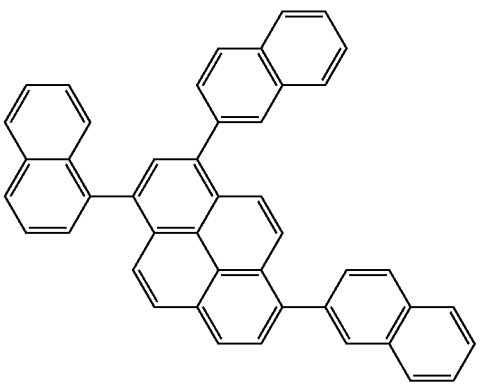
H33
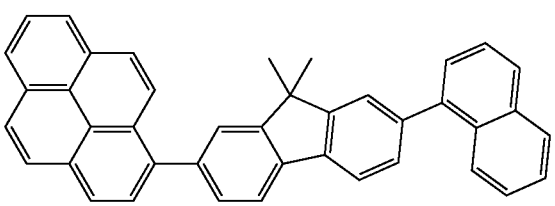
H34
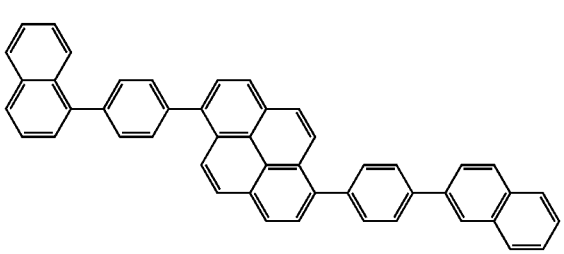

-continued

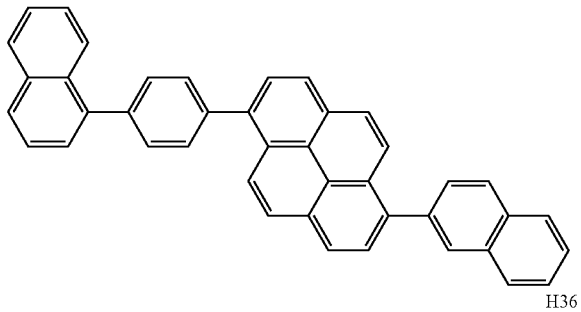

H35

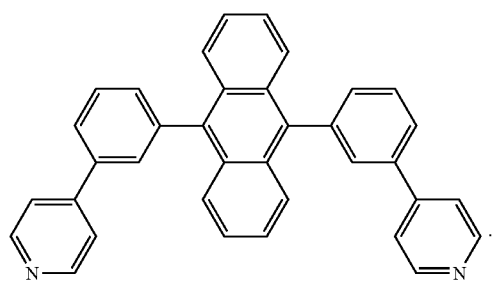

H36

Examples of Electron Transport Material

The electron transport material may be a compound represented by Formula 601-1:

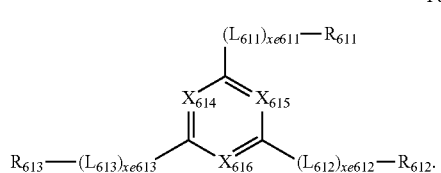

Formula 601-1

In Formula 601-1, $X_{614}$ may be N or $C(R_{614})$, $X_{615}$ may be N or $C(R_{615})$, and $X_{616}$ may be N or $C(R_{616})$, and at least one of $X_{614}$ to $X_{616}$ may be N, $L_{611}$ to $L_{613}$ may each independently be selected from a substituted or unsubstituted $C_3$-$C_{10}$ cycloalkylene group, a substituted or unsubstituted $C_1$-$C_{10}$ heterocycloalkylene group, a substituted or unsubstituted $C_3$-$C_{10}$ cycloalkenylene group, a substituted or unsubstituted $C_1$-$C_{10}$ heterocycloalkenylene group, a substituted or unsubstituted $C_6$-$C_{60}$ arylene group, a substituted or unsubstituted $C_1$-$C_{60}$ heteroarylene group, a substituted or unsubstituted divalent non-aromatic condensed polycyclic group, and a substituted or unsubstituted divalent non-aromatic condensed heteropolycyclic group, xe611 to xe613 may each independently be an integer from 0 to 5, $R_{611}$ to $R_{613}$ may each independently be a substituted or unsubstituted $C_3$-$C_{10}$ cycloalkyl group, a substituted or unsubstituted $C_1$-$C_{10}$ heterocycloalkyl group, a substituted or unsubstituted $C_3$-$C_{10}$ cycloalkenyl group, a substituted or unsubstituted $C_1$-$C_{10}$ heterocycloalkenyl group, a substituted or unsubstituted $C_6$-$C_{60}$ aryl group, a substituted or unsubstituted $C_6$-$C_{60}$ aryloxy group, a substituted or unsubstituted $C_6$-$C_{60}$ arylthio group, a substituted or unsubstituted $C_1$-$C_{60}$ heteroaryl group, a substituted or unsubstituted monovalent non-aromatic condensed polycyclic group, a substituted or unsubstituted monovalent non-aromatic condensed heteropolycyclic group, —Si($Q_{601}$)($Q_{602}$)($Q_{603}$), —C(=O)($Q_{601}$), —S(=O)$_2$($Q_{601}$), or —P(=O)($Q_{601}$)($Q_{602}$), and $R_{614}$ to $R_{616}$ may each independently be hydrogen, deuterium, —F, —Cl, —Br, —I, a hydroxyl group, a cyano group, a nitro group, a $C_1$-$C_{20}$ alkyl group, a $C_1$-$C_{20}$ alkoxy group, a phenyl group, a biphenyl group, a terphenyl group, or a naphthyl group.

$Q_{601}$ to $Q_{603}$ may each independently be defined the same as described in connection with $Q_1$.

For example, xe611 to xe613 in Formula 601-1 may each independently be 0, 1, or 2.

In one or more embodiments, the electron transport material may be one of Compounds ET1 to ET36:

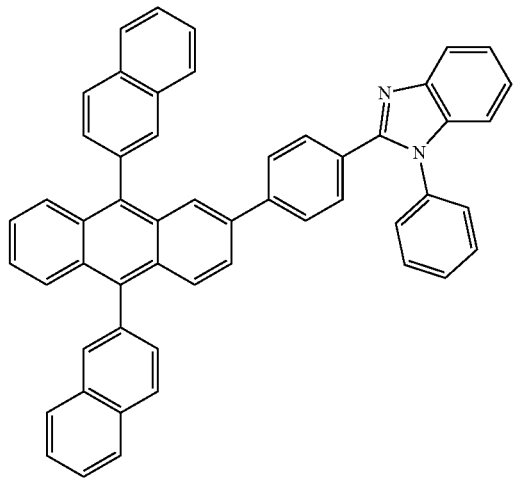

ET1

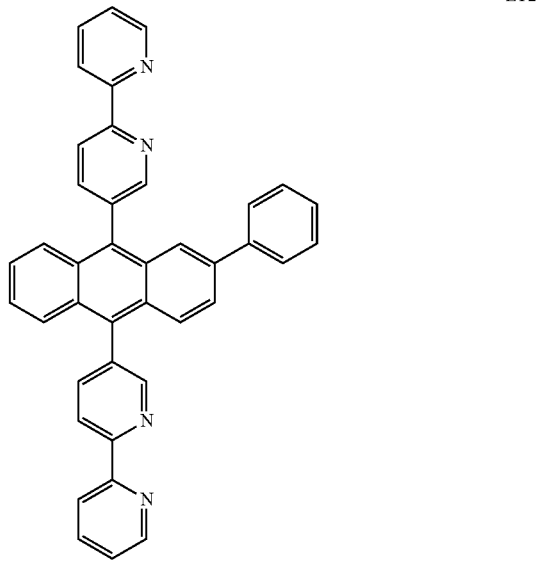

ET2

ET3
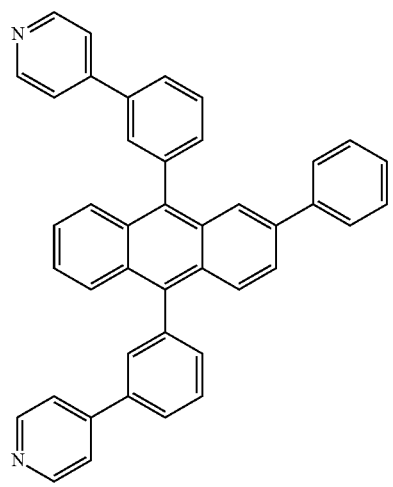
ET6
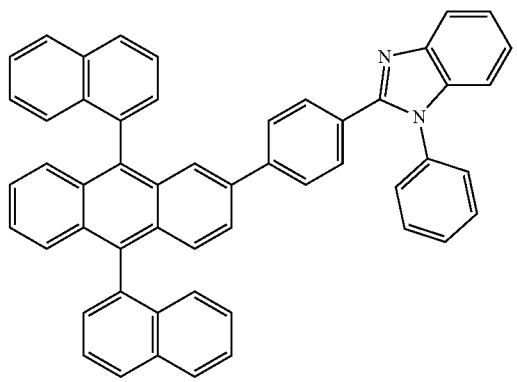
ET4
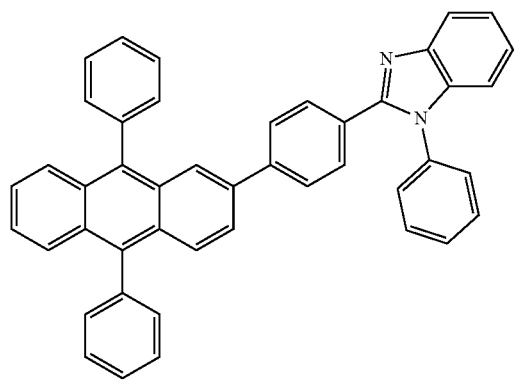
ET7
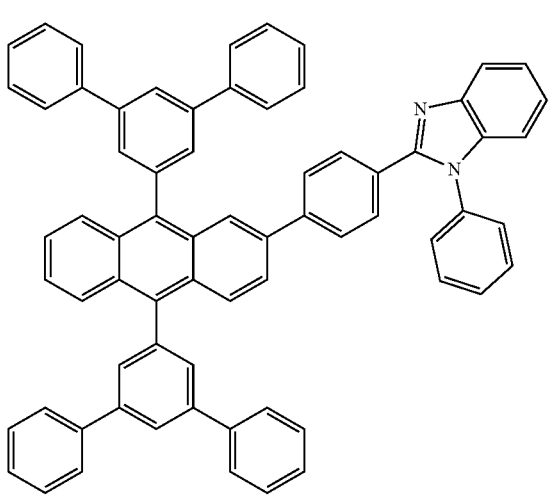
ET5
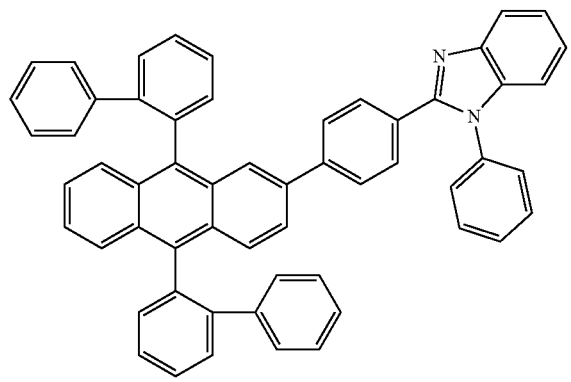
ET8
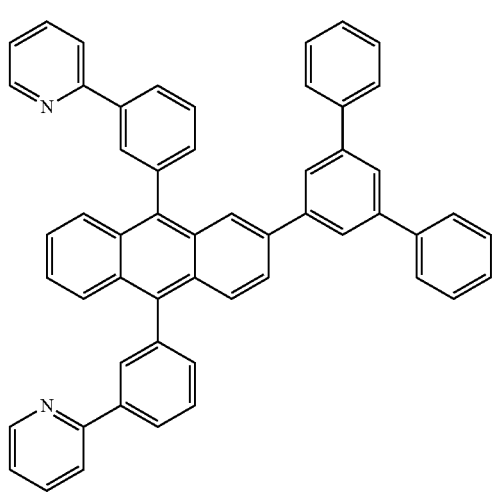

ET9
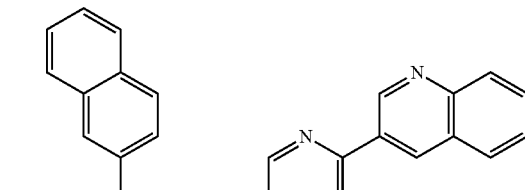
ET11
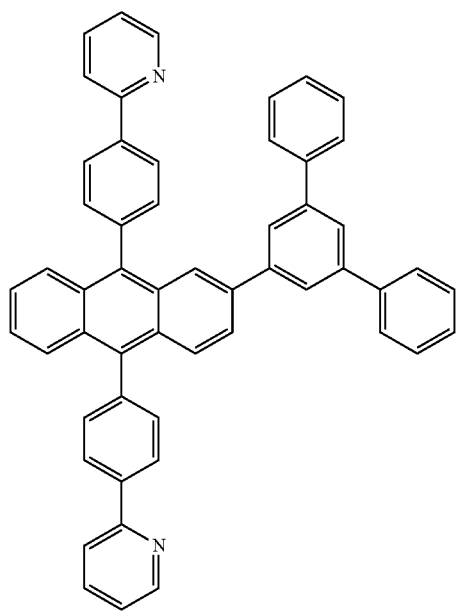
ET12
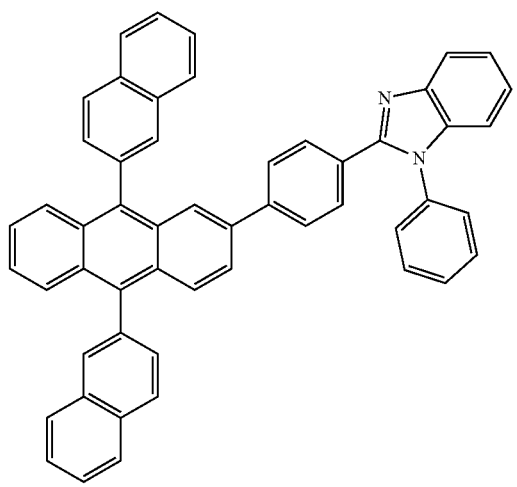
ET10
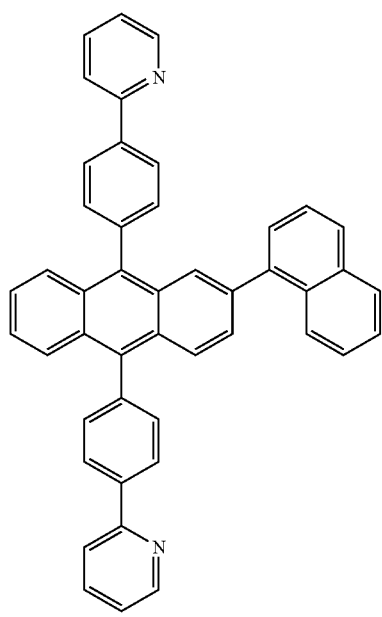
ET13
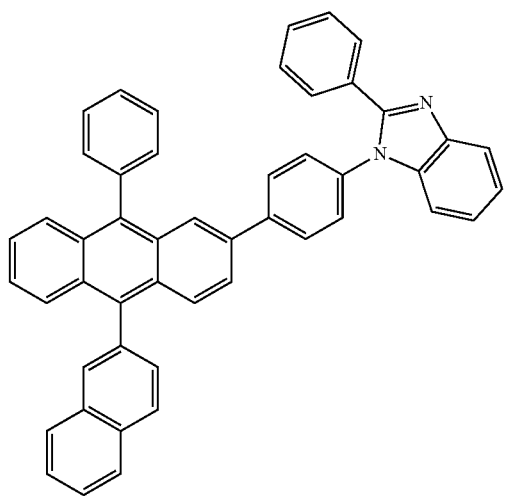

ET14
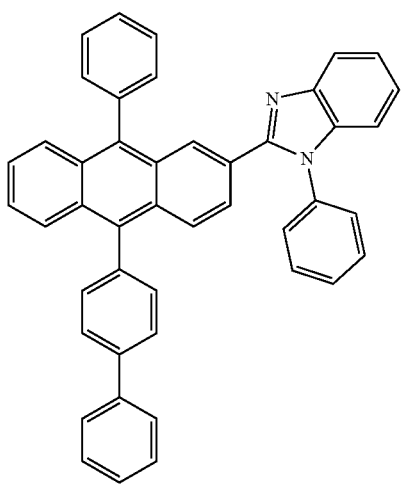
ET15
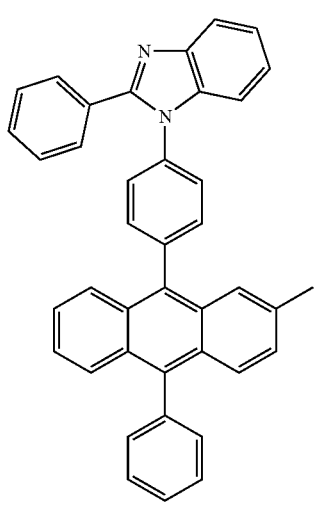
ET16
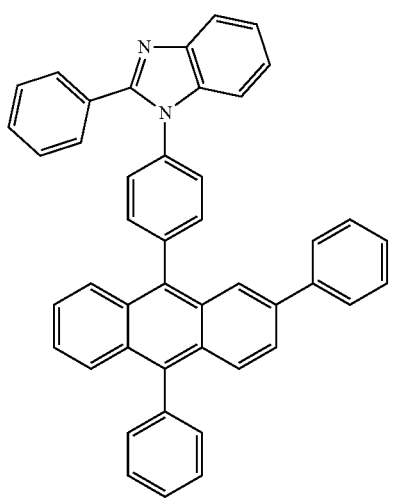
ET17
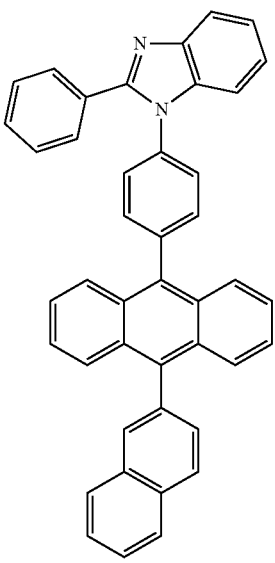
ET18
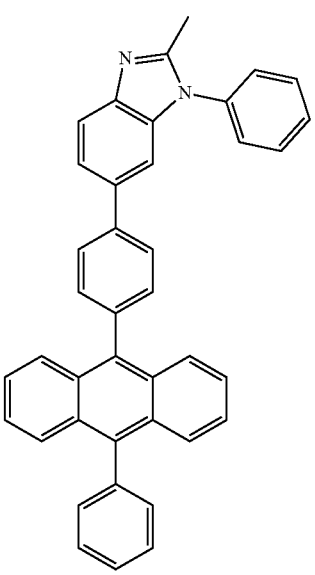
ET19
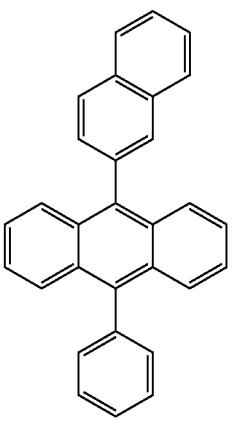

ET20
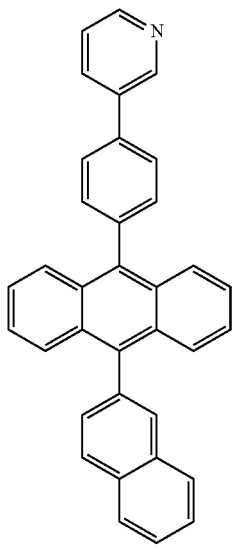
ET21
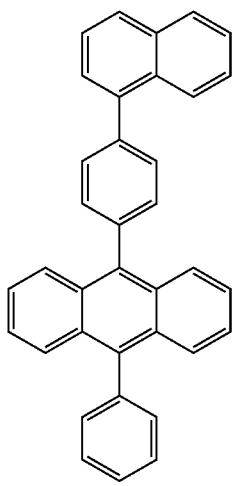
ET22
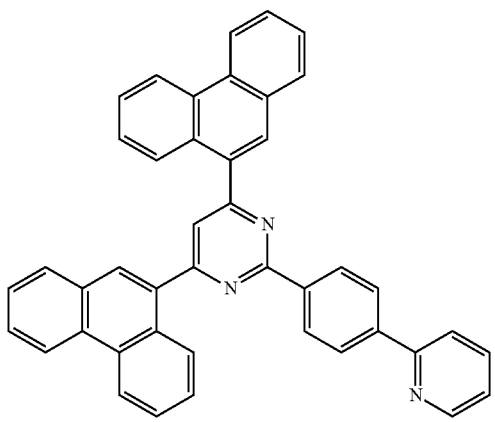
ET23
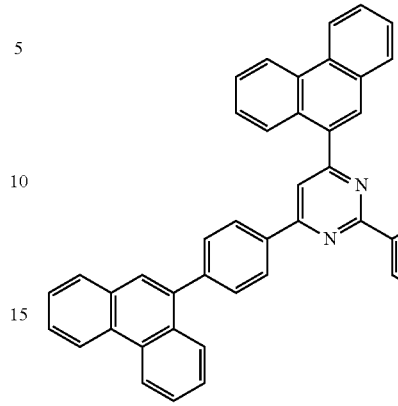
ET24
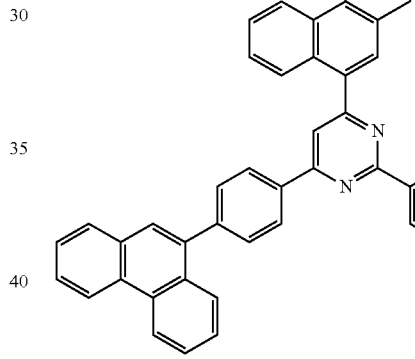
ET25
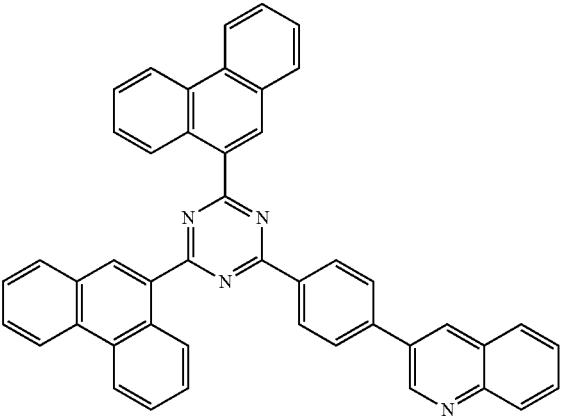

ET26
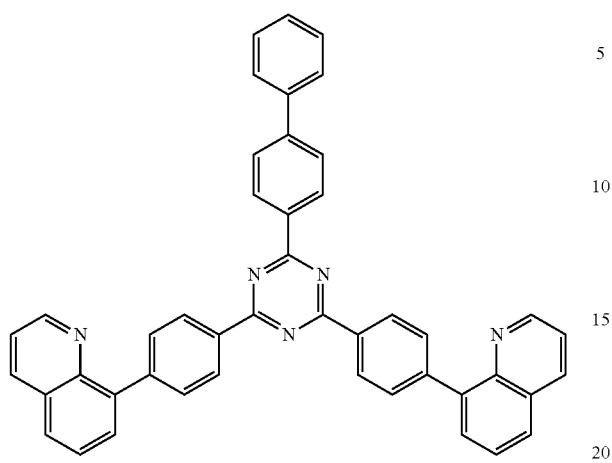
ET29
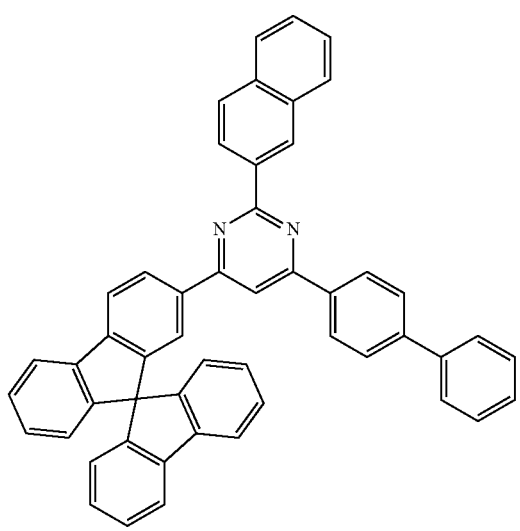
ET27
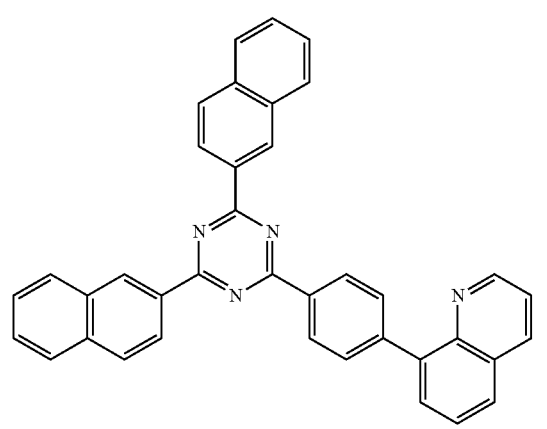
ET30
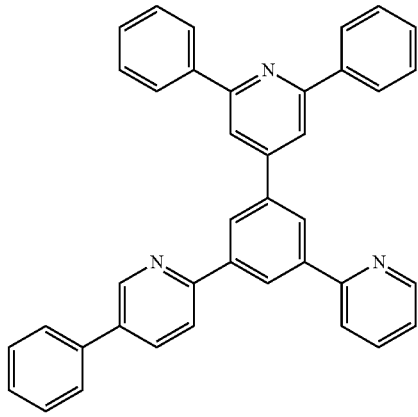
ET28
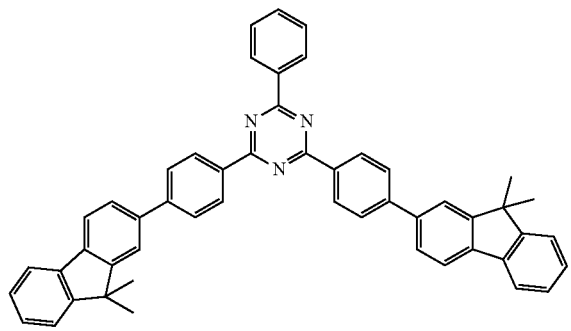
ET31

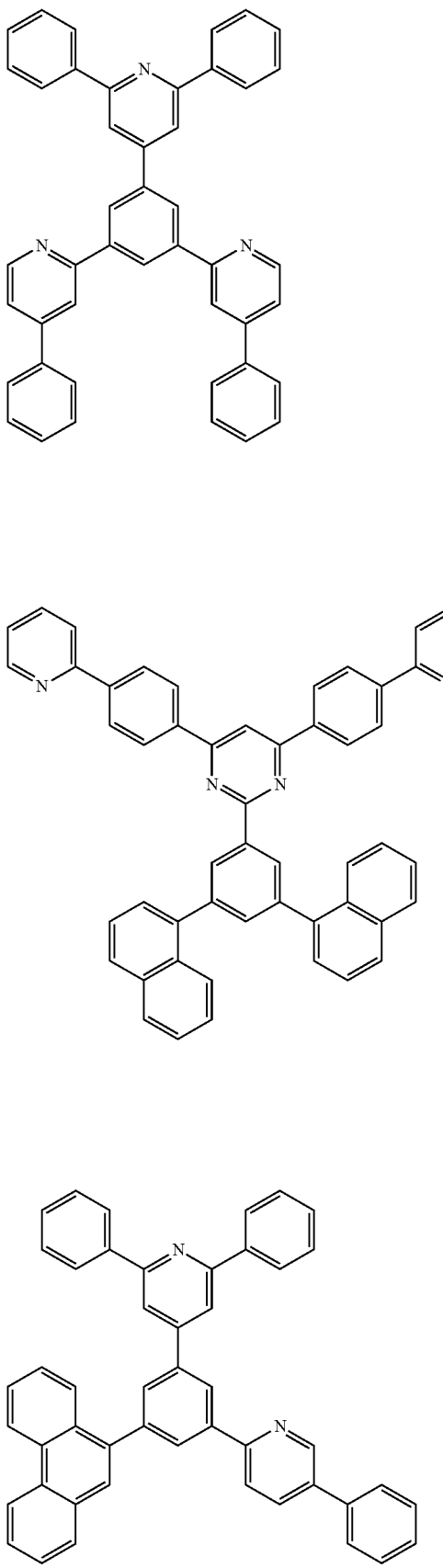

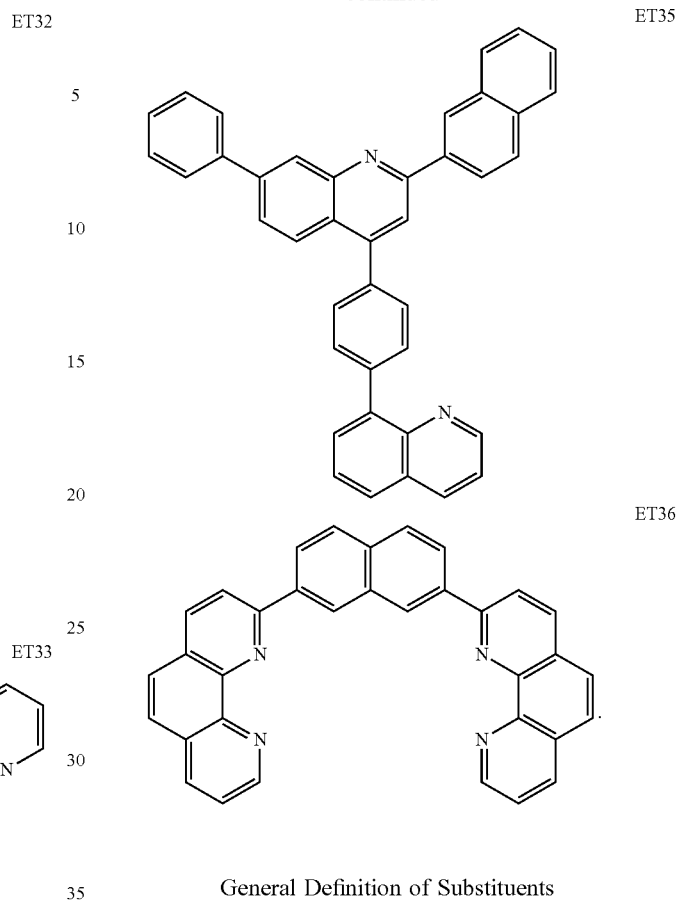

General Definition of Substituents

The term "$C_1$-$C_{60}$ alkyl group" as used herein may refer to a linear or branched saturated aliphatic hydrocarbon monovalent group having 1 to 60 carbon atoms, and non-limiting examples thereof include a methyl group, an ethyl group, an n-propyl group, an isopropyl group, an n-butyl group, a sec-butyl group, an isobutyl group, a tert-butyl group, an n-pentyl group, a tert-pentyl group, a neopentyl group, an isopentyl group, a sec-pentyl group, a 3-pentyl group, a sec-isopentyl group, an n-hexyl group, an isohexyl group, a sec-hexyl group, a tert-hexyl group, an n-heptyl group, an isoheptyl group, a sec-heptyl group, a tert-heptyl group, an n-octyl group, an isooctyl group, a sec-octyl group, a tert-octyl group, an n-nonyl group, an isononyl group, a sec-nonyl group, a tert-nonyl group, an n-decyl group, an isodecyl group, a sec-decyl group, a tert-decyl group, and/or the like. The term "$C_1$-$C_{60}$ alkylene group" as used herein may refer to a divalent group having the same structure as the $C_1$-$C_{60}$ alkyl group.

The term "$C_2$-$C_{60}$ alkenyl group" as used herein may refer to a monovalent hydrocarbon group having at least one carbon-carbon double bond in one or more positions along the hydrocarbon chain of the $C_2$-$C_{60}$ alkyl group (e.g., in the middle and/or at the terminus of the $C_2$-$C_{60}$ alkyl group), and non-limiting examples thereof include an ethenyl group, a prophenyl group, a butenyl group, and/or the like. The term "$C_2$-$C_{60}$ alkenylene group" as used herein may refer to a divalent group having the same structure as the $C_2$-$C_{60}$ alkenyl group.

The term "$C_2$-$C_{60}$ alkynyl group" as used herein may refer to a monovalent hydrocarbon group having at least one carbon-carbon triple bond in one or more positions along the hydrocarbon chain of the $C_2$-$C_{60}$ alkyl group (e.g., in the middle and/or at the terminus of the $C_2$-$C_{60}$ alkyl group), and non-limiting examples thereof include an ethynyl group, a propynyl group, and/or the like. The term "$C_2$-$C_{60}$ alkynylene group" as used herein may refer to a divalent group having the same structure as the $C_2$-$C_{60}$ alkynyl group.

The term "$C_1$-$C_{60}$ alkoxy group" as used herein may refer to a monovalent group represented by —$OA_{101}$ (wherein $A_{101}$ is the $C_1$-$C_{60}$ alkyl group), and non-limiting examples thereof include a methoxy group, an ethoxy group, an isopropyloxy group, and/or the like.

The term "$C_3$-$C_{10}$ cycloalkyl group" as used herein may refer to a monovalent saturated hydrocarbon monocyclic group having 3 to 10 carbon atoms, and non-limiting examples thereof include a cyclopropyl group, a cyclobutyl group, a cyclopentyl group, a cyclohexyl group, a cycloheptyl group, a cyclooctyl group, an adamantanyl group, a norbornanyl group, a bicyclo[1.1.1]pentyl group, a bicyclo[2.1.1]hexyl group, a bicyclo[2.2.1]heptyl group, a bicyclo[2.2.2]octyl group, and/or the like. The term "$C_3$-$C_{10}$ cycloalkylene group" as used herein may refer to a divalent group having the same structure as the $C_3$-$C_{10}$ cycloalkyl group.

The term "$C_1$-$C_{10}$ heterocycloalkyl group" as used herein may refer to a monovalent monocyclic group that has at least one heteroatom (e.g., N, O, Si, P, S, or any combination thereof) as a ring-forming atom, and 1 to 10 carbon atoms. Non-limiting examples of the $C_1$-$C_{10}$ heterocycloalkyl group include a 1,2,3,4-oxatriazolidinyl group, a tetrahydrofuranyl group, a tetrahydrothiophenyl group, and/or the like. The term "$C_1$-$C_{10}$ heterocycloalkylene group" as used herein may refer to a divalent group having the same structure as the $C_1$-$C_{10}$ heterocycloalkyl group.

The term "$C_3$-$C_{10}$ cycloalkenyl group" as used herein may refer to a monovalent monocyclic group that has 3 to 10 carbon atoms, at least one carbon-carbon double bond in its ring, and no aromaticity. Non-limiting examples of the $C_3$-$C_{10}$ cycloalkenyl group include a cyclopentenyl group, a cyclohexenyl group, a cycloheptenyl group, and/or the like. The term "$C_3$-$C_{10}$ cycloalkenylene group" as used herein may refer to a divalent group having the same structure as the $C_3$-$C_{10}$ cycloalkenyl group.

The term "$C_1$-$C_{10}$ heterocycloalkenyl group" as used herein may refer to a monovalent monocyclic group that has at least one heteroatom (e.g., N, O, Si, P, S, or any combination thereof) as a ring-forming atom, 1 to 10 carbon atoms, and at least one double bond in its ring. Non-limiting examples of the $C_1$-$C_{10}$ heterocycloalkenyl group include a 4,5-dihydro-1,2,3,4-oxatriazolyl group, a 2,3-dihydrofuranyl group, a 2,3-dihydrothiophenyl group, and/or the like. The term "$C_1$-$C_{10}$ heterocycloalkenylene group" as used herein may refer to a divalent group having the same structure as the heterocycloalkenyl group.

The term "$C_6$-$C_{60}$ aryl group" as used herein may refer to a monovalent group having a monovalent carbocyclic aromatic system having 6 to 60 carbon atoms. Non-limiting examples of the $C_6$-$C_{60}$ aryl group include a phenyl group, a pentalenyl group, a naphthyl group, an azulenyl group, an indacenyl group, an acenaphthyl group, a phenalenyl group, a phenanthrenyl group, an anthracenyl group, a fluoranthenyl group, a triphenylenyl group, a pyrenyl group, a chrysenyl group, a perylenyl group, a pentaphenyl group, a heptalenyl group, a naphthacenyl group, a picenyl group, a hexacenyl group, a pentacenyl group, a rubicenyl group, a coronenyl group, an ovalenyl group, and/or the like. The term "$C_6$-$C_{60}$ arylene group" as used herein may refer to a divalent group having the same structure as the $C_6$-$C_{60}$ aryl group. When the $C_6$-$C_{60}$ aryl group and the $C_6$-$C_{60}$ arylene group each independently include two or more rings, the respective rings may be condensed to each other.

The term "$C_1$-$C_{60}$ heteroaryl group" as used herein may refer to a monovalent group having a heterocyclic aromatic system that has at least one heteroatom (e.g., N, O, Si, P, S, or any combination thereof) as a ring-forming atom and 1 to 60 carbon atoms. Non-limiting examples of the $C_1$-$C_{60}$ heteroaryl group include a pyridinyl group, a pyrimidinyl group, a pyrazinyl group, a pyridazinyl group, a triazinyl group, a quinolinyl group, a benzoquinolinyl group, an isoquinolinyl group, a benzoisoquinolinyl group, a quinoxalinyl group, a benzoquinoxalinyl group, a quinazolinyl group, a benzoquinazolinyl group, a cinnolinyl group, a phenanthrolinyl group, a phthalazinyl group, a naphthyridinyl group, and/or the like. The term "$C_1$-$C_{60}$ heteroarylene group" as used herein may refer to a divalent group having the same structure as the $C_1$-$C_{60}$ heteroaryl group. When the $C_1$-$C_{60}$ heteroaryl group and the $C_1$-$C_{60}$ heteroarylene group each independently include two or more rings, the respective rings may be condensed to each other.

The term "$C_6$-$C_{60}$ aryloxy group" used herein may refer to a monovalent group represented by —$OA_{102}$ (wherein $A_{102}$ is the $C_6$-$C_{60}$ aryl group), and the term "$C_6$-$C_{60}$ arylthio group" as used herein may refer to a monovalent group represented by —$SA_{103}$ (wherein $A_{103}$ is the $C_6$-$C_{60}$ aryl group).

The term "monovalent non-aromatic condensed polycyclic group" as used herein may refer to a monovalent group having two or more rings condensed to each other, only carbon atoms as ring-forming atoms (for example, 8 to 60 carbon atoms), and no aromaticity in its entire molecular structure. Non-limiting examples of the monovalent non-aromatic condensed polycyclic group include an indenyl group, a fluorenyl group, a spiro-bifluorenyl group, a benzofluorenyl group, an indeno phenanthrenyl group, an indeno anthracenyl group, and/or the like. The term "divalent non-aromatic condensed polycyclic group" as used herein may refer to a divalent group having the same structure as the monovalent non-aromatic condensed polycyclic group.

The term "monovalent non-aromatic condensed heteropolycyclic group" as used herein may refer to a monovalent group having two or more rings condensed to each other, a heteroatom (e.g., N, O, Si, P, S, or any combination thereof) as a ring-forming atom, carbon atoms (for example, 1 to 60 carbon atoms) as the remaining ring-forming atoms, and no aromaticity in its entire molecular structure. Non-limiting examples of the monovalent non-aromatic condensed heteropolycyclic group include a pyrrolyl group, a thiophenyl group, a furanyl group, an indolyl group, a benzoindolyl group, a naphthon indolyl group, an isoindolyl group, a benzoisoindolyl group, a naphthonisoindolyl group, a benzosilolyl group, a benzothiophenyl group, a benzofuranyl group, a carbazolyl group, a dibenzosilolyl group, a dibenzothiophenyl group, a dibenzofuranyl group, an azacarbazolyl group, an azafluorenyl group, an azadibenzosilolyl group, an azadibenzothiophenyl group, an azadibenzofuranyl group, a pyrazolyl group, an imidazolyl group, a triazolyl group, a tetrazolyl group, an oxazolyl group, an isoxazolyl group, a thiazolyl group, an isothiazolyl group, an oxadiazolyl group, a thiadiazolyl group, a benzopyrazolyl group, a benzimidazolyl group, a benzoxazolyl group, a benzothiazolyl group, a benzoxadiazolyl group, a benzothiadiazolyl group, an imidazopyridinyl group, an imidazopyrimidinyl group, an imidazotriazinyl group, an imidazopyrazinyl group, an imidazopyridazinyl group, an indeno carbazolyl group, an indolocarbazolyl group, a benzofurocarbazolyl group, a benzothienocarbazolyl group, a benzosilolocarbazolyl group, a benzoindolocarbazolyl group, a benzocarbazolyl group, a benzonaphthofuranyl group, a benzonaphthothiophenyl group, a benzonaphtho silolyl group, a benzofurodibenzofuranyl group, a benzofurodibenzothiophenyl group, a benzothienodibenzothiophenyl group, and/or the like. The term "divalent non-aromatic condensed heteropolycyclic group" as used herein may refer to a divalent group having the same structure as the monovalent non-aromatic condensed heteropolycyclic group.

The term "$C_5$-$C_{60}$ carbocyclic group" as used herein may refer to a monocyclic group or a polycyclic group, having, as ring-forming atoms, 5 to 60 carbon atoms only. The $C_5$-$C_{60}$ carbocyclic group may be an aromatic carbocyclic group or a non-aromatic carbocyclic group. The $C_5$-$C_{60}$ carbocyclic group may be a compound such as a benzene, a monovalent group such as a phenyl group, or a divalent group such as a phenylene group. In one or more embodiments, depending on the number of substituents connected to the $C_5$-$C_{60}$ carbocyclic group, the $C_5$-$C_{60}$ carbocyclic group may be variously modified as a trivalent group or a tetravalent group.

Non-limiting examples of the $C_5$-$C_{60}$ carbocyclic group include a cyclopentadiene group, a benzene group, a pentalene group, a naphthalene group, an azulene group, an indacene group, acenaphthylene group, a phenalene group, a phenanthrene group, an anthracene group, a fluoranthene group, a triphenylene group, a pyrene group, a chrysene group, a perylene group, a pentaphene group, a heptalene group, a naphthacene group, a picene group, a hexacene group, a pentacene group, a rubicene group, a coronene group, an ovalene group, an indene group, a fluorene group, a spiro-bifluorene group, a benzofluorene group, an indeno phenanthrene group, an indenoanthracene group, and/or the like.

The term "$C_1$-$C_{60}$ heterocyclic group" as used herein may refer to a monocyclic group or a polycyclic group, having 1 to 60 carbon atoms and a heteroatom (e.g., N, O, Si, P, S, or any combination thereof) as ring-forming atoms. A non-limiting example of the $C_1$-$C_{60}$ heterocyclic group includes an aromatic heterocyclic group or a non-aromatic heterocyclic group. The $C_1$-$C_{60}$ heterocyclic group may be a compound such as a pyridine group, a monovalent group such as a pyridinyl group, or a divalent group such as a pyridinylene group. In one or more embodiments, depending on the number of substituents connected to the $C_1$-$C_{60}$ heterocyclic group, the $C_1$-$C_{60}$ heterocyclic group may be variously modified as a trivalent group or a tetravalent group.

Non-limiting examples of the $C_1$-$C_{60}$ heterocyclic group include a pyridine group, a pyrimidine group, a pyrazine group, a pyridazine group, a triazine group, a quinoline group, a benzoquinoline group, an isoquinoline group, a benzoisoquinoline group, a quinoxaline group, a benzoquinoxaline group, a quinazoline group, a benzoquinazoline group, a cinnoline group, a phenanthroline group, a phthalazine group, a naphthyridine group, a pyrrole group, a thiophene group, a furan group, an indole group, a benzoindole group, a naphthon indole group, an isoindole group, a benzo isoindole group, a naphthon isoindole group, a benzosilole group, a benzothiophene group, a benzofuran group, a carbazole group, a dibenzosilole group, a dibenzothiophene group, a dibenzofuran group, an azacarbazole group, an azafluorine group, an azadibenzosilole group, an azadibenzothiophene group, an azadibenzofuran group, a pyrazole group, an imidazole group, a triazole group, a tetrazole group, an oxazole group, an isoxazole group, a thiazole group, an isothiazole group, an oxadiazole group, a thiadiazole group, a benzopyrazole group, a benzimidazole group, a benzoxazole group, a benzothiazole group, a benzoxadiazole group, a benzothiadiazole group, an imidazopyridine group, an imidazopyrimidine group, an imidazotriazine group, an imidazopyrazine group, an imidazopyridazine group, an indenocarbazole group, an indolocarbazole group, a benzofurocarbazole group, a benzothienocarbazole group, a benzosilolocarbazole group, a benzoindolocarbazole group, a benzocarbazole group, a benzonaphthofuran group, a benzonaphthothiophene group, a benzonaphthosilole group, a benzofurodibenzofuran group, a benzofurodibenzothiophene group, a benzothienodibenzothiophene group, and/or the like.

A substituent(s) of the substituted $C_5$-$C_{60}$ carbocyclic group, the substituted $C_1$-$C_{60}$ heterocyclic group, the substituted $C_1$-$C_{20}$ alkylene group, the substituted $C_2$-$C_{20}$ alkenylene group, the substituted $C_1$-$C_{60}$ alkylene group, the substituted $C_2$-$C_{60}$ alkenylene group, the substituted $C_3$-$C_{10}$ cycloalkylene group, the substituted $C_1$-$C_{10}$ heterocycloalkylene group, the substituted $C_3$-$C_{10}$ cycloalkenylene group, the substituted $C_1$-$C_{10}$ heterocycloalkenylene group, the substituted $C_6$-$C_{60}$ arylene group, the substituted $C_1$-$C_{60}$ heteroarylene group, the substituted divalent non-aromatic condensed polycyclic group, the substituted divalent non-aromatic condensed heteropolycyclic group, the substituted $C_1$-$C_{60}$ alkyl group, the substituted $C_2$-$C_{60}$ alkenyl group, the substituted $C_2$-$C_{60}$ alkynyl group, the substituted $C_1$-$C_{60}$ alkoxy group, the substituted $C_3$-$C_{10}$ cycloalkyl group, the substituted $C_1$-$C_{10}$ heterocycloalkyl group, the substituted $C_3$-$C_{10}$ cycloalkenyl group, the substituted $C_1$-$C_{10}$ heterocycloalkenyl group, the substituted $C_6$-$C_{60}$ aryl group, the substituted $C_6$-$C_{60}$ aryloxy group, the substituted $C_6$-$C_{60}$ arylthio group, the substituted $C_1$-$C_{60}$ heteroaryl group, the substituted monovalent non-aromatic condensed polycyclic group, and the substituted monovalent non-aromatic condensed heteropolycyclic group may be:

deuterium, —F, —Cl, —Br, —I, a hydroxyl group, a cyano group, or a nitro group;

a $C_1$-$C_{60}$ alkyl group, a $C_2$-$C_{60}$ alkenyl group, a $C_2$-$C_{60}$ alkynyl group, or a $C_{60}$ alkoxy group, each unsubstituted or substituted with deuterium, —F, —Cl, —Br, —I, a hydroxyl group, a cyano group, a nitro group, a $C_3$-$C_{10}$ cycloalkyl group, a $C_1$-$C_{10}$ heterocycloalkyl group, a $C_3$-$C_{10}$ cycloalkenyl group, a $C_1$-$C_{10}$ heterocycloalkenyl group, a $C_6$-$C_{60}$ aryl group, a $C_6$-$C_{60}$ aryloxy group, a $C_6$-$C_{60}$ arylthio group, a $C_1$-$C_{60}$ heteroaryl group, a monovalent non-aromatic condensed polycyclic group, a monovalent non-aromatic condensed heteropolycyclic group, —Si($C_{211}$)($C_{212}$)($Q_{13}$), —N($Q_{11}$)($Q_{12}$), —B($Q_{11}$)($Q_{12}$), —C(=O)($Q_{11}$), —S(=O)$_2$($Q_{11}$), —P(=O)($Q_{11}$)($Q_{12}$), or any combination thereof;

a $C_3$-$C_{10}$ cycloalkyl group, a $C_1$-$C_{10}$ heterocycloalkyl group, a $C_3$-$C_{10}$ cycloalkenyl group, a $C_1$-$C_{10}$ heterocycloalkenyl group, a $C_6$-$C_{60}$ aryl group, a $C_6$-$C_{60}$ aryloxy group, a $C_6$-$C_{60}$ arylthio group, a $C_1$-$C_{60}$ heteroaryl group, a monovalent non-aromatic condensed polycyclic group, or a monovalent non-aromatic condensed heteropolycyclic group, each unsubstituted or substituted with deuterium, —F, —Cl, —Br, —I, a hydroxyl group, a cyano group, a nitro group, a $C_1$-$C_{60}$ alkyl group, a $C_2$-$C_{60}$ alkenyl group, a $C_2$-$C_{60}$ alkynyl group, a $C_1$-$C_{60}$ alkoxy group, a $C_3$-$C_{10}$ cycloalkyl group, a $C_{10}$ heterocycloalkyl group, a $C_3$-$C_{10}$ cycloalkenyl group, a $C_1$-$C_{10}$ heterocycloalkenyl group, a $C_6$-$C_{60}$ aryl group, a $C_6$-$C_{60}$ aryloxy group, a $C_6$-$C_{60}$ arylthio group, a $C_1$-$C_{60}$ heteroaryl group, a monovalent non-aromatic condensed polycyclic group, a monovalent non-aromatic condensed heteropolycyclic group, —Si($Q_{21}$)($Q_{22}$)

($Q_{23}$), —N($Q_{21}$)($Q_{22}$), —B($Q_{21}$)($Q_{22}$), —C(=O)($Q_{21}$), —S(=O)$_2$($Q_{21}$), —P(=O)($Q_{21}$)($Q_{22}$), or any combination thereof;

—Si($Q_{31}$)($Q_{32}$)($Q_{33}$), —N($Q_{31}$)($Q_{32}$), —B($Q_{31}$)($Q_{32}$), —C(=O)($Q_{31}$), —S(=O)$_2$($Q_{31}$), or —P(=O)($Q_{31}$)($Q_{32}$); or any combination thereof.

In the present specification, $Q_1$, $Q_{11}$ to $Q_{13}$, $Q_{21}$ to $Q_{23}$, and $Q_{31}$ to $Q_{33}$ may each independently be hydrogen, deuterium, —F, —Cl, —Br, —I, a hydroxyl group, a cyano group, a nitro group, a $C_1$-$C_{60}$ alkyl group, a $C_2$-$C_{60}$ alkenyl group, a $C_2$-$C_{60}$ alkynyl group, a $C_1$-$C_{60}$ alkoxy group, a $C_3$-$C_{10}$ cycloalkyl group, a $C_1$-$C_{10}$ heterocycloalkyl group, a $C_3$-$C_{10}$ cycloalkenyl group, a $C_1$-$C_{10}$ heterocycloalkenyl group, a $C_6$-$C_{60}$ aryl group, a $C_1$-$C_{60}$ heteroaryl group, a monovalent non-aromatic condensed polycyclic group, a monovalent non-aromatic condensed heteropolycyclic group, a biphenyl group, or a terphenyl group.

In one or more embodiments, the first monomer in the first composition may be one of Compounds 1 to 11 and 101 to 107 below, or any combination thereof:

1

2

3

4

5

-continued

6
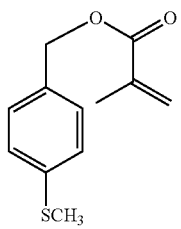

7
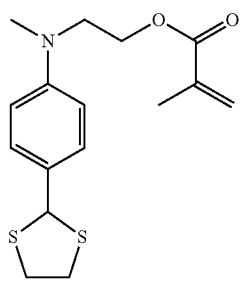

8
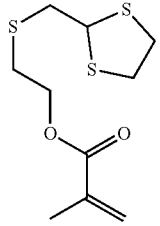

9
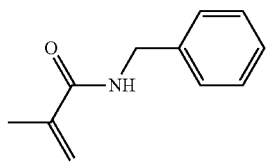

10
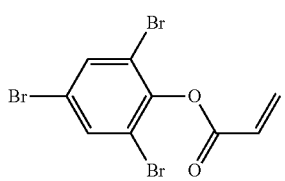

11
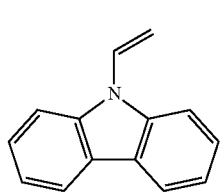

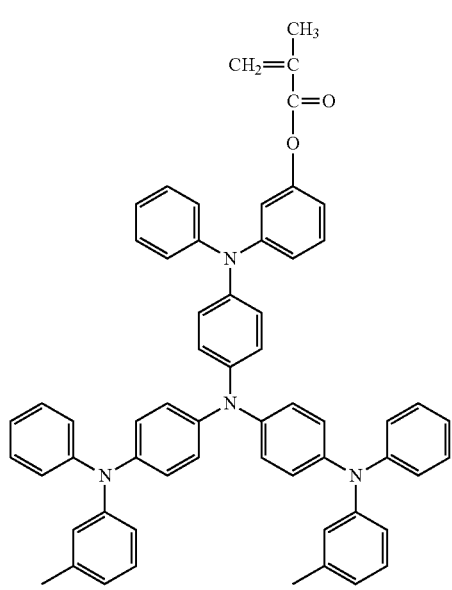
101
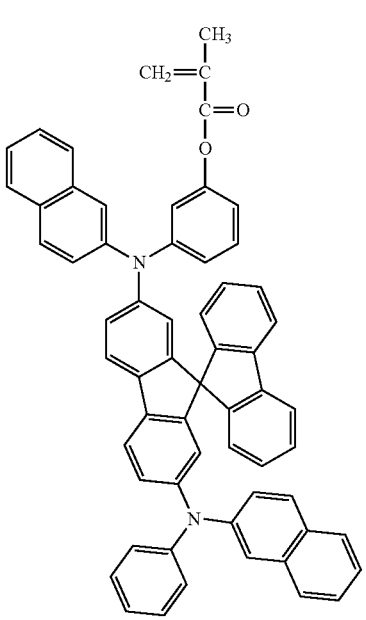
103
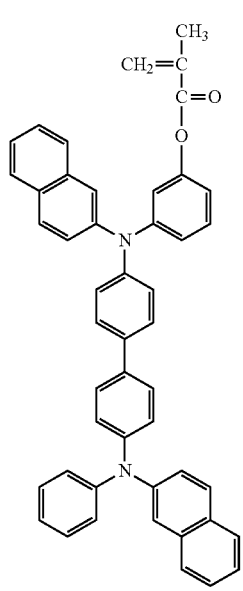
102
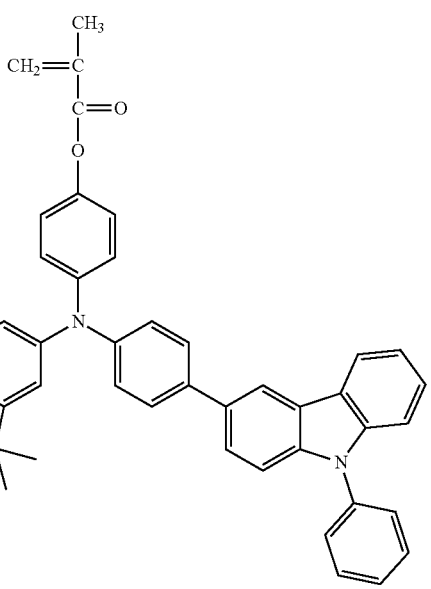
104

105

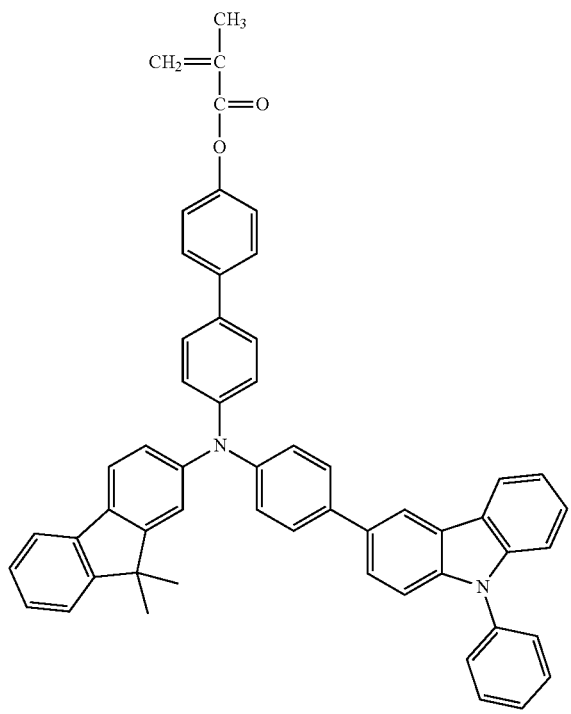

106

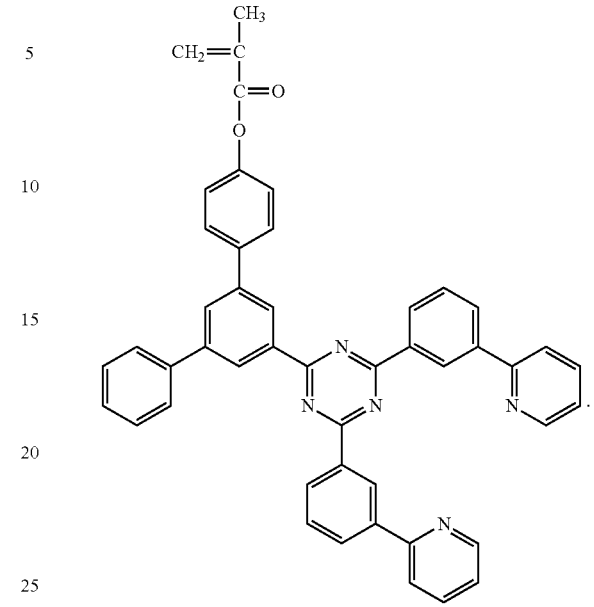

107

A content (e.g., amount) of the first monomer may be from about 5 parts by volume to about 20 parts by volume based on 100 parts by volume of the first composition. When the content of the first monomer is within the range above, the quantum dot-containing complex 110 in which the quantum dot 111 is uniformly (or substantially uniformly) dispersed may be prepared.

In the first composition, the polymerization initiator may be any polymerization initiator capable of initiating polymerization of the first monomer. For example, the polymerization initiator may be a water-soluble polymerization initiator suitable for solution polymerization.

In one or more embodiments, the polymerization initiator in the first composition may be KPS.

In the first composition, the solvent may be any solvent that may be suitably mixed with the first monomer and/or the like. For example, the solvent in the first composition may be water.

A content (e.g., amount) of the solvent may be from about 70 parts by volume to about 99 parts by volume based on 100 parts by volume of the first composition. When the content of the solvent is within the range above, the quantum dot-containing complex 110 in which the quantum dot 111 is dispersed in the first matrix material 113 with a uniform (or substantially uniform) degree of dispersion may be prepared.

Next, the first monomer in the first composition may be converted into at least a part of the first matrix material 113 so that the second composition, which includes the solvent and the quantum dot-containing complex 110 in which the quantum dot 111 is dispersed in the first matrix material 113, may be prepared. The step of "converting the first monomer into at least a part of the first matrix material 113" may be understood as a step of "forming the first polymer by polymerization of the first monomer."

In one or more embodiments, the solvent in the first composition may be water, and the first monomer in the first composition may include a water-soluble vinyl-based monomer, a water-soluble acryl-based monomer, a water-soluble acrylamide-based monomer, or any combination thereof.

The first composition may further include a water-soluble polymerization initiator, and the preparing of the second composition may be performed by using solution polymerization.

For example, the preparing of the second composition may include stirring the first composition under conditions of a temperature from about 50° C. to about 150° C. and a speed from about 300 rpm to about 800 rpm. When the conditions are satisfied as described above, the first monomer may be effectively converted into at least a part of the first matrix material 113, and the quantum dot-containing complex 110 may have a spherical particle form.

Afterwards, by removing the solvent from the second composition, the quantum dot-containing complex 110 may be obtained. The obtaining of the quantum dot-containing complex 110 may be performed by using lyophilization (or freeze drying).

Then, the third composition including the quantum dot-containing complex 110, the second monomer, the polymerization initiator, and a solvent may be prepared.

A content (e.g., amount) of the quantum dot-containing complex 110 may be from about 5 parts by weight to about 25 parts by weight, for example, from about 10 parts by weight to about 20 parts by weight, based on 100 parts by weight of the third composition. When the content of the quantum dot-containing complex 110 is within any of the ranges above, the quantum dot-containing material 1 having excellent (or suitable) light conversion efficiency while maintaining an excellent (or suitable) degree of dispersion of the quantum dot-containing complex 110 in the third composition may be prepared.

The second monomer in the third composition may be a photopolymerizable monomer. For example, the second monomer may be an acryl-based monomer(s).

Non-limiting examples of the acryl-based monomer include: a monofunctional (meth)acrylate monomer, such as 2-ethylphenoxy(meth)acrylate, 2-ethylthiophenyl(meth)acrylate, phenyl(meth)acrylate, biphenylmethyl(meth)acrylate, benzyl(meth)acrylate, 2-phenylethyl(meth)acrylate, 3-phenylpropyl(meth)acrylate, 4-phenylbutyl(meth)acrylate, 2-(2-methylphenyl)ethyl(meth)acrylate, 2-(3-methylphenyl)ethyl(meth)acrylate, 2-(4-methylphenyl)ethyl(meth)acrylate, 2-(4-propylphenyl)ethyl(meth)acrylate, 2-(4-(1-methylethyl)phenyl)ethyl(meth)acrylate, 2-(4-methoxyphenyl)ethyl(meth)acrylate, 2-(4-cyclohexylphenyl)ethyl(meth)acrylate, 2-(2-chlorophenyl)ethyl(meth)acrylate, 2-(3-chlorophenyl)ethyl(meth)acrylate, 2-(4-chlorophenyl)ethyl(meth)acrylate, 2-(4-bromophenyl)ethyl (meth)acrylate, 2-(3-phenylphenyl)ethyl(meth)acrylate, 2-(4-benzylphenyl)ethyl (meth)acrylate, o-phenylphenoxyethylacrylate, and/or the like; a difunctional (meth)acrylate monomer, such as dicyclopentenyl di(meth)acrylate, caprolactone-modified dicyclopentenyl di(meth)acrylate, allylated cyclohexyl di(meth)acrylate, tricyclodecanedimethanoldi(meth)acrylate, dimethylol dicyclopentane di(meth) acrylate, 9,9-bis[4-(2-acryloyloxyethoxy)phenyl]fluorene, bisfluorene di(meth)acrylate, bisphenol-modified fluorene di(meth)acrylate, phenyl-modified urethane di(meth)acrylate, bisfluorene-modified urethane di(meth)acrylate, and/or the like; a trifunctional (meth)acrylate monomer, such as trimethylolpropane tri(meth)acrylate, ethoxylated trimethylolpropane tri(meth)acrylate, propoxylated trimethylolpropane tri(meth)acrylate, tris2-hydroxyethylisocyanurate tri (meth)acrylate, glycerin tri(meth)acrylate, pentaerythritol tri(meth)acrylate, dipentaerythritol tri(meth)acrylate, ditrimethylolpropane tri(meth)acrylate and/or the like; a tetrafunctional (meth)acrylate monomer, such as pentaerythritol tetra (meth)acrylate, ditrimethylolpropane tetra(meth)acrylate, dipentaerythritol tetra(meth)acrylate and/or the like; a pentafunctional (meth)acrylate monomer, such as dipentaerythritol penta(meth)acrylate, ditrimethylolpropane penta(meth) acrylate and/or the like; a hexafunctional (meth)acrylate monomer, such as dipentaerythritol hexa(meth)acrylate, ditrimethylolpropane hexa(meth)acrylate, and/or the like; or any combination thereof.

The second monomer may not include an epoxy-based monomer.

A content (e.g., amount) of the second monomer may be from about 10 parts by weight to about 50 parts by weight based on 100 parts by weight of the third composition. When the content of the second monomer is within the range above, the second matrix material 130 may have high rigidity due to efficient formation of an exposed part during exposure.

The polymerization initiator in the third composition may be any suitable polymerization initiator, such as any suitable photopolymerization initiator capable of initiating the polymerization of the second monomer.

In terms of polymerization characteristics, initiation efficiency, absorption wavelength, availability, cost, and/or the like, the photopolymerization initiator may be an acetone-based compound, a benzophenone-based compound, a triazine-based compound, a biimidazole-based compound, an oxime compound, a thioxanthone-based compound, or any combination thereof.

Non-limiting examples of the acethone-based compound include diethoxyacetophenone, 2-hydroxy-2-methyl-1-phenylpropane-1-one, benzyldimethyl ketal, 2-hydroxy-1-[4-(2-hydroxyethoxy)phenyl]-2-methylpropane-1-one, 1-hydroxycyclohexylphenylketone, 2-methyl-1-(4-methylthiophenyl)-2-morpholinopropane-1-one, 2-benzyl-2-dimethylamino-1-(4-morpholinophenyl)butane-1-one, 2-hydroxy-2-methyl-1-[4-(1-methylvinyl)phenyl]propane-1-one, 2-(4-methylbenzyl)-2-(dimethylamino)-1-(4-morpholinophenyl)butane-1-one, and/or the like.

Non-limiting examples of the benzophenone-based compound include benzophenone, methyl o-benzoyl benzoate, 4-phenylbenzophenone, 4-benzoyl-4'-methyldiphenylsulfide, 3,3',4,4'-tetra(tert-butylperoxycarbonyl)benzophenone, 2,4,6-trimethylbenzophenone, and/or the like.

Non-limiting examples of the triazine-based compound include 2,4-bis(trichloromethyl)-6-(4-methoxyphenyl)-1,3,5-triazine, 2,4-bis(trichloromethyl)-6-(4-methoxynaphthyl)-1,3,5-triazine, 2,4-bis(trichloromethyl)-6-piperonyl-1,3,5-triazine, 2,4-bis(trichloromethyl)-6-(4-methoxystyryl)-1,3, 5-triazine, 2,4-bis(trichloromethyl)-6-[2-(5-methylfuran-2-yl)ethenyl]-1,3,5-triazine, 2,4-bis(trichloromethyl)-6-[2-(furan-2-yl)ethenyl]-1,3,5-triazine, 2,4-bis(trichloromethyl)-6-[2-(4-diethylamino-2-methylphenyl) ethenyl]-1,3,5-triazine, 2,4-bis(trichloromethyl)-6-[2-(3,4-dimethoxyphenyl)ethenyl]-1,3,5-triazine, and/or the like.

Non-limiting examples of the biimidazole-based compound include 2,2'-bis(2-chlorophenyl)-4,4',5,5'-tetraphenyl biimidazole, 2,2'-bis(2,3-dichlorophenyl)-4,4',5,5'-tetraphenylbiimidazole, 2,2'-bis(2-chlorophenyl)-4,4',5,5'-tetra (alkoxyphenyl)biimidazole, 2,2'-bis(2-chlorophenyl)-4,4',5, 5'-tetra(trialkoxyphenyl)biimidazole, 2,2-bis(2,6-dichlorophenyl)-4,4',5,5'-tetraphenyl-1,2'-biimidazole, a biimidazole compound in which a phenyl group is substituted at a 4,4',5,5' position with a carboalkoxy group, and/or the like.

Non-limiting examples of the oxime compound include o-ethoxycarbonyl-α-oxyimino-1-phenylpropane-1-one and/or the like.

Non-limiting examples of the thioxanthone-based compound include 2-isopropylthioxanthone, 2,4-diethylthioxanthone, 2,4-dichlorothioxanthone, 1-chloro-4-propoxythioxanthone, and/or the like.

Non-limiting examples of a commercially available photopolymerization initiator include: Irgacure-907, Irgacure 184, Irgacure 819, Irgacure 250, Darocur 1173, Irgacure OXE 01, and Irgacure OXE 02 (manufactured by BASF); WPI-113, WPI-116, WPI-169, WPI-170, WPI-124, WPAG-638, WPAG-469, WPAG-370, WPAG-367, and WPAG-336 (manufactured by Wako Pure Chemical Industries, Ltd.); B2380, B2381, C1390, D2238, D2248, D2253, 10591, T1608, T1609, T2041, and T2042 (manufactured by TOKYO CHEMICAL INDUSTRY CO., LTD); AT-6992, AT-6976 (manufactured by ACETO); CPI-100, CPI-100P, CPI-101A, CPI-200K, and CPI-210S (manufactured by San-Apro Ltd.); SP-056, SP-066, SP-130, SP-140, SP-150, SP-170, SP-171, and SP-172 (manufactured by ADEKA CORPORATION), CD-1010, CD-1011, and CD-1012 (manufactured by Satomer Co., Ltd.); San Aid SI-60, SI-80, SI-100, SI-60L, SI-80L, SI-100L, SI-L145, SI-L150, SI-L160, SI-L110, and SI-L147 (manufactured by SAN-SHIN CHEMICAL INDUSTRY CO., LTD.); and PI2074 (manufactured by Rhodia Japan, Ltd.).

A content (e.g., amount) of the photopolymerization initiator may be from about 0.1 parts by weight to about 10 parts by weight, for example, from about 2 parts by weight to about 8 parts by weight, based on 100 parts by weight of the third composition. When the content of the photopolymerization initiator is within any of the ranges above, the second matrix material 130 may have high rigidity due to efficient formation of an exposed part during exposure.

The solvent in the third composition may be selected from suitable solvents that are mixable with the quantum dot-containing complex 110, the second monomer, the polymerization initiator, and/or the like.

Non-limiting examples of the solvent in the third composition include an alkyleneglycol alkylether-based solvent, such as ethyleneglycol monomethylether, ethyleneglycol monoethylether, ethyleneglycol monopropylether, ethyleneglycol monobutylether, propyleneglycol monomethylether, propyleneglycol methylethylether, and/or the like; a diethyleneglycol dialkylether-based solvent, such as diethyleneglycol dimethylether, diethyleneglycol diethylether, diethyleneglycol dipropylether, diethyleneglycol dibutylether, and/or the like; an alkyleneglycol alkyletheracetate-based solvent, such as methyl cellosolve acetate, ethyl cellosolve acetate, propyleneglycol monomethyletheracetate, propyleneglycol monoethyletheracetate, propyleneglycol monopropyletheracetate, and/or the like; an alkoxy alkylacetate-based solvent, such as methoxybutylacetate, methoxypentylacetate, and/or the like; an aromatic hydrocarbon-based solvent, such as benzene, toluene, xylene, mesitylene, and/or the like; a ketone-based solvent, such as methylethylketone, acetone, methylamylketone, methylisobutylketone, cyclohexanone, and/or the like; an alcohol-based solvent, such as ethanol, propanol, butanol, hexanol, cyclohexanol, ethyleneglycol, glycerin, and/or the like; an ester-based solvent, such as 3-ethoxypropionic acid ethylester, 3-methoxypropionic acid methylester, 3-phenylpropionic acid ethylester, and/or the like; a cyclic ester-based solvent, such as γ-butyrolactone and/or the like; or any combination thereof.

A content (e.g., amount) of the solvent may be from about 20 parts by weight to about 70 parts by weight, for example, from about 30 parts by weight to about 60 parts by weight, based on 100 parts by weight of the third composition. When the content of the solvent is within any of the ranges above, the third composition may have excellent (or suitable) viscosity and may maintain high dispersibility of solids in the third composition.

The third composition may further include, in addition to the quantum dot-containing complex 110, the second monomer, the polymerization initiator, and the solvent, an alkali-soluble resin, a dispersing agent, or any combination thereof.

The alkali-soluble resin may serve to remove a non-exposed part after exposure with respect to the third composition by rendering an alkali-solubility to the non-exposed area, so as to leave an exposed area; to uniformly disperse the quantum dot-containing complex 110 of the third composition in the third composition; and/or to protect the quantum dot-containing complex 110 during the preparation of the quantum dot-containing material 1.

The alkali-soluble resin may have an acid value of 50 to 200 (KOHmg/g). The term "acid value" as used herein may refer to a value measured as an amount (mg) of potassium hydroxide required to neutralize 1 g of a polymer, and is related to solubility. When the acid value of the alkali-soluble resin is within the range above, excellent (or suitable) development speed, excellent (or suitable) adhesion to a substrate, and storage stability of the third composition may be achieved.

The alkali-soluble resin may be a polymer derived from a carboxyl group-containing unsaturated monomer, a copolymer with a monomer copolymerizable with the carboxyl group-containing unsaturated monomer and having an unsaturated bond, or any combination thereof.

Non-limiting examples of the carboxyl group-containing unsaturated monomer include unsaturated monocarboxylic acid, unsaturated dicarboxylic acid, unsaturated tricarboxylic acid, or any combination thereof. Non-limiting examples of the unsaturated monocarboxylic acid include acrylic acid, methacrylic acid, crotonic acid, α-chloroacrylic acid, cinnamic acid, and/or the like. Non-limiting examples of the unsaturated dicarboxylic acid include maleic acid, fumaric acid, itaconic acid, citraconic acid, mesaconic acid, and/or the like. Non-limiting examples of the unsaturated dicarboxylic acid include acid anhydride (e.g., maleic acid anhydride, itaconic acid anhydride, citraconic acid anhydride, and/or the like). In addition, non-limiting examples of the unsaturated dicarboxylic acid include mono(2-(meth)acryloyloxyalkyl)ester of the unsaturated dicarboxylic acid, such as succinic acid mono(2-acryloyloxyethyl)ester, succinic acid mono(2-methacryloyloxyethyl)ester, phthalic acid mono(2-acryloyloxyethyl)ester, phthalic acid mono(2-methacryloyloxyethyl)ester, and/or the like. The unsaturated dicarboxylic acid may include mono(meth)acrylates of a dicarboxy polymer at both ends, and non-limiting examples thereof include ω-carboxy-polycaprolactone monoacrylate, ω-carboxy-polycaprolactone monomethacylate, and/or the like. The carboxyl group-containing monomer may be used alone or in mixture of 2 or more.

In one or more embodiments, the monomer copolymerizable with the carboxyl group-containing unsaturated monomer may include an aromatic vinyl compound, an unsaturated carboxylic acid ester compound, an unsaturated carboxylic acid amino alkylester compound, an unsaturated carboxylic acid glycidylester compound, a carboxylic acid vinylester compound, an unsaturated ether compound, a cyanized vinyl compound, an unsaturated amide compound, an unsaturated imide compound, an aliphatic conjugated dien compound, a macromonomer having a monoacryloyl group or a monomethacryloyl at the end of the molecular chain, a bulky monomer, or any combination thereof.

A content (e.g., amount) of the alkali-soluble resin may be from about 5 parts by weight to about 80 parts by weight, for example, from about 10 parts by weight to about 70 parts by weight, based on 100 parts by weight of the third composition. When the content of the alkali-soluble resin is within the range above, a film reduction of a pixel portion of the exposed part at the time of development may be prevented or reduced so that omission of a non-pixel part may be protective (or be protected).

The dispersing agent may be used to improve deagglomeration effect of the quantum dot-containing complex 110 in the third composition. For use as the dispersing agent, a resin-type (e.g., resin-containing) dispersing agent, such as a phosphoric acid ester-based dispersing agent, a urethane-based dispersing agent, an acryl-based dispersing agent, and/or the like, may be used. In one or more embodiments, as the dispersing agent, commercially available products manufactured by BYK-Chemie company, such as DISPER BYK-103, DISPER BYK-110, DISPER BYK-111, DISPER BYK-2000, DISPER BYK-2001, DISPER BYK-2011, DISPER BYK-2070, DISPER BYK-2150, DISPER BYK-160, DISPER BYK-161, DISPER BYK-162, DISPER BYK-163, DISPER BYK-164, and/or DISPER BYK-166, may be used.

A content (e.g., amount) of the dispersing agent may be from about 0.1 parts by weight to about 15 parts by weight, for example, about 1 part by weight to about 10 parts by weight, based on 100 parts by weight of the third composition. When the content of the dispersing agent is within any of the ranges above, aggregation of the quantum dot-containing complex 110 in the third composition may be substantially prevented.

In one or more embodiments, the third composition may further include, as necessary, an adhesion promoter for increasing adhesion to a substrate, a surfactant for improving coating characteristics, an antioxidant, an ultraviolet absorber, or any combination thereof.

Next, the second monomer in the third composition may be converted into at least a part of the second matrix material 130 so that the quantum dot-containing material 1 in which quantum dot-containing complex 110 is dispersed in the second matrix material 130 may be prepared.

The step (or act) of "converting the second monomer into at least a part of the second matrix material 130" may be understood as a step (or act) of "forming the second polymer by polymerization of the second monomer".

The preparing of the quantum dot-containing material 1 may be performed by using photopolymerization. Here, in order to prepare the quantum dot-containing material 1 in a thin-film form, the third composition may be provided on any suitable substrate, and then, exposure may be performed thereon to perform photopolymerization. The preparing of the quantum dot-containing material 1 may further include, before and/or after the exposure, baking the third composition for removing at least a part of the solvent from the third composition.

In one or more embodiments, the refractive index of the first monomer may be greater than that of the second monomer.

In one or more embodiments, the refractive index of the first monomer may be greater than that of the second monomer, wherein the refractive index of the first monomer may be from about 1.55 to about 2.00, for example, from about 1.55 to about 1.85, and the refractive index of the second monomer may be from about 1.30 to about 1.55, for example, from about 1.40 to about 1.50. In one or more embodiments, a difference between the refractive index of the first monomer and the refractive index of the second monomer may be from about 0.05 to about 0.60, for example, from about 0.06 to about 0.45. When the first monomer and the second monomer each having the refractive index within any of the ranges above are used, the first matrix material and the second matrix material satisfying the refractive index relationships described herein may be more easily prepared.

For example, the refractive indices of Compounds 1 to 11 and 101 to 107, which are examples of the first monomer, and the refractive index of dipentaerythritol hexaacrylate (DPHA), which is an example of the second monomer, are summarized in Table 1 below. Here, it is confirmed that the refractive index of the first monomer is greater than that of the second monomer.

TABLE 1

| Compound | Refractive index |
| --- | --- |
| Compound 1 | 1.620 |
| Compound 2 | 1.565 |
| Compound 3 | 1.577 |
| Compound 4 | 1.600 |
| Compound 5 | 1.663 |
| Compound 6 | 1.628 |
| Compound 7 | 1.692 |
| Compound 8 | 1.731 |
| Compound 9 | 1.597 |
| Compound 10 | 1.600 |
| Compound 11 | 1.683 |
| Compound 101 | 1.750 |
| Compound 102 | 1.710 |
| Compound 103 | 1.700 |
| Compound 104 | 1.720 |
| Compound 105 | 1.720 |
| Compound 106 | 1.780 |
| Compound 107 | 1.800 |
| DPHA | 1.488 |

The quantum dot-containing material 1 illustrated in the drawing and prepared according to the method described above may be used for various optical members.

Thus, another embodiment of the present disclosure provides an optical member including the quantum dot-containing material 1. For example, both the quantum dot-containing material 1 and the optical member including the same may have a thin-film.

The optical member may be a color conversion member. When the color conversion member includes the quantum dot-containing material 1 having excellent light conversion efficiency as described above, the color conversion member may also have excellent light conversion efficiency.

The color conversion member may include a substrate and a pattern layer formed on the substrate.

The substrate may be a self-substrate of the color conversion member, or may refer to an area in which the color conversion member is arranged among various apparatuses (e.g., a display apparatus). The substrate may be formed of glass, silicon (Si), silicon oxide (SiOx), or a polymer. The polymer forming the substrate may be polyethersulfone (PES) and/or polycarbonate (PC).

The pattern layer may include the quantum dot-containing material 1 in the thin-film form. For example, the pattern layer may be the quantum dot-containing material 1 in the thin-film form. The pattern layer may be a layer formed by providing the third composition on the substrate, and then, by exposing (e.g., by performing photopolymerization on the second monomer in the third composition), developing, and/or heat treating the substrate, with a set or predetermined pattern.

The color conversion member including the substrate and the pattern layer may further include a partition wall or a black matrix, which is formed between each pattern layer. In one or more embodiments, the color conversion member may further include a color filter for additionally improving light conversion efficiency.

The color conversion member may include a red pattern layer emitting red light, a green pattern layer emitting green light, a blue pattern layer emitting blue light, or any combination thereof. The red pattern layer, the green pattern layer, and/or the blue pattern layer may be implemented by controlling the components, the compositions, and/or the structure of the quantum dot 111 in the quantum dot-containing material 1.

Another embodiment of the present disclosure provides an apparatus including the quantum dot-containing material 1 (or, the optical member including the quantum dot-containing material 1).

The apparatus may further include a light source, and the quantum dot-containing material 1 (or, the optical member including the quantum dot-containing material 1) may be arranged in the path of light emitted from the light source.

The light source may emit blue light, red light, green light, or white light. For example, the light source may emit blue light.

The light source may be an organic light-emitting device (OLED) or a light-emitting diode (LED).

Because the light emitted from the light source as described above may be photoconverted by the quantum dot 111 in the quantum dot-containing material 1 while passing through the quantum dot-containing material 1, light having a different wavelength from that of the light emitted from the light source may be emitted by quantum dot-containing material 1.

The apparatus may be selected from various suitable display apparatuses, lighting apparatuses, and/or the like.

Hereinafter, the quantum dot-containing material 1 and the method of preparing the same will be described in more detail through Examples and/or Comparative Examples.

EXAMPLES 1.1 Preparation of Quantum Dot-Containing Complex 1

0.035 g of a polymerization initiator and 350 mL of distilled water were mixed in a 500 mL three-necked flask, and then 35 mL of a first monomer and a quantum dot (in a content of about 0.3 parts by weight based on 100 parts by weight of the first monomer) were added thereto. The resulting mixture was vigorously stirred under a nitrogen atmosphere at a temperature of 80° C. at a speed of 500 rpm, and then, a reaction was allowed to proceed for 4 hours. After the completion of the reaction, a washing process was performed thereon several times by using distilled water and methanol (MeOH), and the resulting product was lyophilized, thereby preparing Quantum dot-containing complex 1 (spherical particle) with monodispersity. The polymerization initiator, the first monomer, and the quantum dot used herein were as follows:
Polymerization initiator: KPS (potassium persulfate)
First monomer: Compound 1
Quantum dot: InP/ZnS core-shell quantum dot (average particle diameter: 3 nm to 8 nm)

1.2 Preparation of Quantum Dot-Containing Complexes 2 to 6

Quantum dot-containing complexes 2 to 6 were each prepared in the same (or substantially the same) manner as in the preparation of Quantum dot-containing complex 1, except that Compounds 3, 4, 9, 101, and 107 were respectively used instead of Compound 1 as the first monomer:

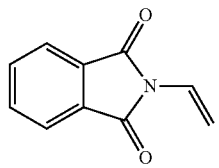

1

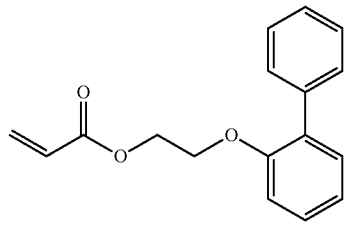

3

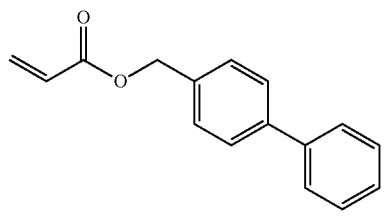

4

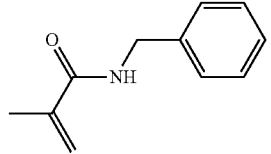

9

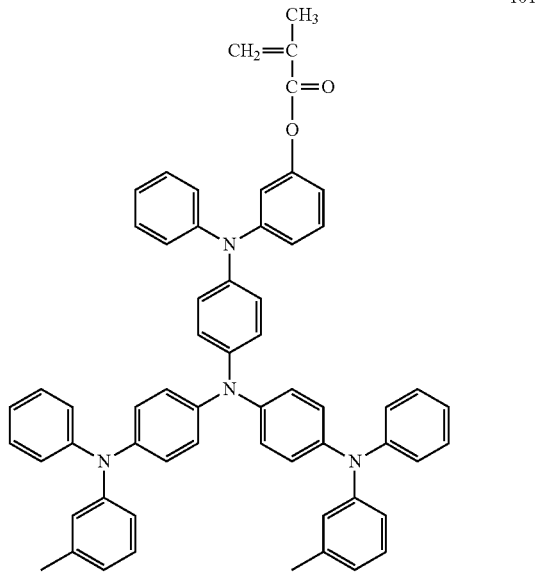

101

-continued

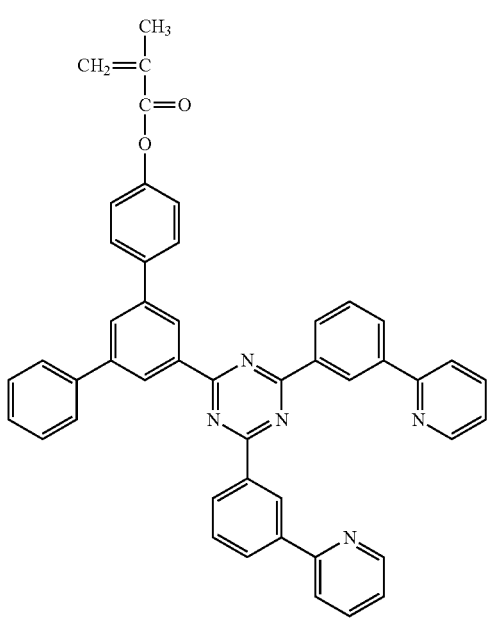

107

1.3 Preparation of Quantum Dot-Containing Complex A

Quantum dot-containing complex A was prepared in the same (or substantially the same) manner as in the preparation of Quantum dot-containing complex 1, except that a mixture of lauryl methacrylate and trimethylolpropane trimethacrylate mixed at a volume ratio of 8.25:1 was used instead of Compound 1 as the first monomer.

Evaluation Example 1 (Evaluation of Average Particle Diameter and Uniformity Coefficient)

After evaluating a particle size distribution curve of each of the Quantum dot-containing complexes 1 to 6 and A using a particle size analyzer (ELSZ-2000ZS manufactured by Otsuka Electronics), an average particle diameter (D50) and a uniformity coefficient (D60/D10) of each of the Quantum dot-containing complexes 1 to 6 and A were evaluated, and results thereof are shown in Table 2.

TABLE 2

| Quantum dot-containing complex No. | Average particle diameter (D50) (nm) | Uniformity coefficient (D60/D10) |
|---|---|---|
| 1 | 138 | 1.5 |
| 2 | 147 | 1.8 |
| 3 | 145 | 1.7 |
| 4 | 138 | 1.5 |
| 5 | 144 | 1.4 |
| 6 | 139 | 1.5 |
| A | 135 | 1.8 |

Referring to Table 2, it was confirmed that the Quantum dot-containing complexes 1 to 6 and A each had a relatively uniform particle size distribution.

2.1 Preparation of Quantum Dot-Containing Composition 1

A quantum dot-containing complex (15 weight %), a second monomer (30 weight %), a photopolymerization initiator (5 weight %), a dispersing agent (5 weight %), a first solvent (30 weight %), and a second solvent (15 weight %) shown below were mixed to prepare Quantum dot-containing composition 1.

Quantum dot-containing complex: Quantum dot-containing complex 1

Second monomer: Dipentaerythritol hexa acrylate (DPHA) (Aldrich 407283)

Photopolymerization initiator: Irgacure-907 (BASF company)

Dispersing agent: DISPER BYK-2011 (BYK-Chemie company)

First solvent: 3-phenyl-propionic acid ethyl ester

Second solvent: Propyleneglycolmonomethyletheracetate

2.2 Preparation of Quantum Dot-Containing Compositions 2 to 6

Quantum dot-containing compositions 2 to 6 were each prepared in the same (or substantially the same) manner as in the preparation of Quantum dot-containing composition 1, except that, as the quantum dot-containing complex, Quantum dot-containing complexes 2 to 6 were respectively used instead of Quantum dot-containing complex 1.

2.3 Preparation of Quantum Dot-Containing Composition a

Quantum dot-containing composition A was prepared in the same (or substantially the same) manner as in the preparation of Quantum dot-containing composition 1, except that Quantum dot-containing complex A was used instead of Quantum dot-containing complex 1 as the quantum dot-containing complex, and urethane acrylate (Dymax OP-4-20639) was used instead of DPHA as the second monomer.

2.4 Preparation of Quantum Dot-Containing Composition B

Quantum dot-containing composition B was prepared in the same (or substantially the same) manner as in the preparation of Quantum dot-containing composition 1, except that Quantum dot-containing complex A was used instead of Quantum dot-containing complex 1 as the quantum dot-containing complex, and urethane acrylate (Dymax OP-4-20632) was used instead of DPHA as the second monomer.

2.5 Preparation of Quantum Dot-Containing Composition C

Quantum dot-containing composition C was prepared in the same (or substantially the same) manner as in the preparation of Quantum dot-containing composition 1, except that a mixture of InP/ZnS core-shell quantum dot (10 weight %) used in the preparation of Quantum dot-containing complex 1 and $TiO_2$ particle (Degussa, average particle diameter D50: 5 weight %), was used as the quantum dot-containing complex.

Evaluation Example 2 (Evaluation of Dispersion Stability)

Each of the Quantum dot-containing compositions 1 to 6 and C was sampled and a dispersion particle size thereof was evaluated using a particle size analyzer (ELSZ-2000ZS manufactured by Otsuka). Next, each of sampled Quantum dot-containing compositions 1 to 6 and C was stored for 30 days at a temperature of 25° C. in a relative humidity of 20%, and then, evaluation of dispersed particle size was performed thereon using the same method as described above. Results thereof are shown in Table 3.

TABLE 3

| Quantum dot-containing composition No. | Initial dispersed particle size (nm) | Dispersed particle size after 30 days (nm) |
|---|---|---|
| 1 | 142 | 153 |
| 2 | 153 | 151 |
| 3 | 150 | 149 |
| 4 | 146 | 156 |
| 5 | 152 | 154 |

TABLE 3-continued

| Quantum dot-containing composition No. | Initial dispersed particle size (nm) | Dispersed particle size after 30 days (nm) |
|---|---|---|
| 6 | 147 | 161 |
| C | 846 | 2727 |

Referring to Table 3, it was confirmed that Quantum dot-containing compositions 1 to 6 had excellent dispersion stability.

Evaluation Example 3 (Evaluation of Discharge Stability)

After sampling each of the Quantum dot-containing compositions 1 to 6 and C, discharge stability of an inkjet head was evaluated by performing evaluation of impact accuracy thereon during 30 days of discharge using an inkjet printer, and results thereof are shown in Table 4. When the impact accuracy at 30 days of discharge was ±5 μm in the x-axis and the y-axis directions, the discharge stability was evaluated as "excellent.". When the impact accuracy at 30 days of discharge was not ±5 μm in the x-axis and the y-axis directions, the discharge stability was evaluated as "poor".

TABLE 4

| Quantum dot-containing composition No. | Discharge stability |
|---|---|
| 1 | Excellent |
| 2 | Excellent |
| 3 | Excellent |
| 4 | Excellent |
| 5 | Excellent |
| 6 | Excellent |
| C | Poor |

3.1 Preparation of Quantum Dot-Containing Thin-Film 1

Quantum dot-containing composition 1 was coated on a glass substrate using a spin coater, and a pre-baking process was performed thereon using a hotplate at a temperature of 100° C. for 1 minute. After irradiating UV light (wavelength of 365 nm) using an exposing device in an exposure content of 200 mJ/cm², a post-baking process was performed under a nitrogen atmosphere in a hot oven at a temperature of 180° C. for 30 minutes, thereby preparing Quantum dot-containing thin-film 1 having a thickness of 3 μm.

3.2 Preparation of Quantum Dot-Containing Thin-Films 2 to 6 and a to C

Quantum dot-containing thin-films 2 to 6 and A to C were each prepared in the same (or substantially the same) manner as in the preparation of Quantum dot-containing thin-film 1, except that Quantum dot-containing compositions 2 to 6 and A to C were respectively used instead of Quantum dot-containing composition 1.

Evaluation Example 4 (Evaluation of Refractive Index)

For each of the Quantum dot-containing thin-films 1 to 6, A and B, the refractive indexes of the first matrix material (i.e., first matrix material 113 in the drawing) in the quantum dot-containing complex and the second matrix material (i.e., second matrix material 130 in the drawing) in the quantum dot-containing thin-film were evaluated at a temperature of 25° C. in a relative humidity of 50% using Ellipsometer M-2000 (J. A. Woollam) based on a wavelength of 589 nm according to the Cauchy Film Model. Results thereof are summarized in Table 5.

TABLE 5

| Quantum dot-containing thin-film No. | First monomer used in preparation of quantum dot-containing complex | Refractive index of first monomer used in preparation of quantum dot-containing complex | Refractive index of first matrix material (i.e., first matrix material 113 in the FIGURE) in quantum dot-containing complex | Second monomer used in preparation of quantum dot-containing composition | Refractive index of second monomer used in preparation of quantum dot-containing | Refractive index of second matrix material (i.e., second matrix material 130 in the FIGURE) in quantum dot-containing thin-film |
|---|---|---|---|---|---|---|
| 1 | Compound 1 | 1.620 | 1.625 | DPHA | 1.488 | 1.490 |
| 2 | Compound 3 | 1.577 | 1.580 | DPHA | 1.488 | 1.490 |
| 3 | Compound 4 | 1.600 | 1.602 | DPHA | 1.488 | 1.490 |
| 4 | Compound 9 | 1.597 | 1.599 | DPHA | 1.488 | 1.490 |
| 5 | Compound 101 | 1.750 | 1.752 | DPHA | 1.488 | 1.490 |
| 6 | Compound 107 | 1.800 | 1.802 | DPHA | 1.488 | 1.490 |
| A | Mixture of lauryl methacrylate and trimethylolpropane trimethacrylate | 1.470 | 1.473 | Urethane acrylate (Dymax OP-4-20639) | 1.470 | 1.473 |
| B | Mixture of lauryl methacrylate and trimethylolpropane trimethacrylate | 1.470 | 1.473 | Urethane acrylate (Dymax OP-4-20632) | 1.550 | 1.552 |

Referring to Table 5, it was confirmed that the refractive indices of the first matrix materials in Quantum dot-containing thin-films 1 to 6 were greater than those of the second matrix materials, and that the refractive indices of the first matrix materials in Quantum dot-containing thin-films A and B were not greater than those of the second matrix materials.

Evaluation Example 5 (Evaluation of Light Conversion Rate)

A blue backlight unit (blue BLU) (emitting blue light having a maximum emission wavelength of 455 nm) equipped with a diffusing film was prepared. Next, a bare glass was disposed on the blue BLU, and the emission amount of blue light was measured using a spectrometer (CAS 140 CT manufactured by Instrument Systems) to set a reference point. Then, the bare glass substrate was replaced by a glass substrate on which each of Quantum dot-containing thin-films 1 to 6 and A to C was formed. The increased amount of peaks converted into green light with respect to the reduced amount of absorption peaks of blue light was measured using a spectrometer, so as to evaluate light conversion rates of Quantum dot-containing thin-films 1 to 6 and A to C, and results thereof are shown in Table 6.

TABLE 6

| Quantum dot-containing thin-film No. | Light conversion rate (%) |
| --- | --- |
| 1 | 37 |
| 2 | 35 |
| 3 | 38 |
| 4 | 32 |
| 5 | 39 |
| 6 | 40 |
| A | 21 |
| B | 22 |
| C | 23 |

Referring to Table 6, it was confirmed that Quantum dot-containing thin-films 1 to 6 had excellent light conversion rates as compared to Quantum dot-containing thin-films A to C.

According to the one or more embodiments of the present disclosure, the optical member including the quantum dot-containing material has excellent light conversion efficiency, and accordingly, use of the quantum dot-containing material may result in implementation of various high-quality apparatuses.

As used herein, the terms "use," "using," and "used" may be considered synonymous with the terms "utilize," "utilizing," and "utilized," respectively.

In addition, the terms "substantially," "about," and similar terms are used as terms of approximation and not as terms of degree, and are intended to account for the inherent deviations in measured or calculated values that would be recognized by those of ordinary skill in the art.

Also, any numerical range recited herein is intended to include all subranges of the same numerical precision subsumed within the recited range. For example, a range of "1.0 to 10.0" is intended to include all subranges between (and including) the recited minimum value of 1.0 and the recited maximum value of 10.0, that is, having a minimum value equal to or greater than 1.0 and a maximum value equal to or less than 10.0, such as, for example, 2.4 to 7.6. Any maximum numerical limitation recited herein is intended to include all lower numerical limitations subsumed therein and any minimum numerical limitation recited in this specification is intended to include all higher numerical limitations subsumed therein. Accordingly, applicant reserves the right to amend this specification, including the claims, to expressly recite any sub-range subsumed within the ranges expressly recited herein.

It should be understood that embodiments described herein should be considered in a descriptive sense only and not for purposes of limitation. Descriptions of features or aspects within each embodiment should typically be considered as available for other similar features or aspects in other embodiments.

While one or more embodiments have been described with reference to the drawing, it will be understood by those of ordinary skill in the art that various changes in form and details may be made therein without departing from the spirit and scope of the present disclosure as defined by the following claims and their equivalents.

What is claimed is:

1. A quantum dot-containing material comprising:
a quantum dot-containing complex comprising a quantum dot and a first matrix material; and
a second matrix material,
wherein the quantum dot is dispersed in the first matrix material and the first matrix material comprises i) a first polymer which serves as a medium where the quantum dot is dispersed and ii) a polymerization initiator,
the quantum dot-containing complex is dispersed in the second matrix material, and
a refractive index of the first matrix material is greater than a refractive index of the second matrix material.

2. The quantum dot-containing material of claim 1,
wherein the quantum dot comprises a group III-V semiconductor compound and a group II-VI semiconductor compound.

3. The quantum dot-containing material of claim 1,
wherein the refractive index of the first matrix material is from 1.55 to 2.00, and the refractive index of the second matrix material is from 1.30 to 1.55.

4. The quantum dot-containing material of claim 1,
wherein a difference between the refractive index of the first matrix material and the refractive index of the second matrix material is from 0.05 to 0.60.

5. The quantum dot-containing material of claim 1,
wherein the first polymer is derived from polymerization of a first monomer by solution polymerization, and
the first monomer is a water-soluble vinyl-based monomer, a water-soluble acryl-based monomer, a water-soluble acrylamide-based monomer, or any combination thereof.

6. The quantum dot-containing material of claim 1,
the second matrix material comprises a second polymer derived from polymerization of a second monomer by photopolymerization, and
the second monomer comprises an acryl-based monomer.

7. The quantum dot-containing material of claim 1,
wherein the quantum dot-containing complex is a spherical particle.

8. The quantum dot-containing material of claim 1,
wherein an average particle diameter (D50) of the quantum dot-containing complex is from 40 nm to 1,000 nm.

9. The quantum dot-containing material of claim 1,
wherein the quantum dot-containing material is a thin film.

10. A method of preparing a quantum dot-containing material, the method comprising:
   preparing a first composition comprising a quantum dot, a first monomer, a polymerization initiator, and a solvent;
   preparing a second composition by converting the first monomer in the first composition into at least a part of a first matrix material, the second composition comprising a quantum dot-containing complex and the solvent, the quantum dot-containing complex comprising the quantum dot and the first matrix material, in which the quantum dot is dispersed;
   obtaining the quantum dot-containing complex by removing the solvent from the second composition;
   preparing a third composition comprising the quantum dot-containing complex, a second monomer, a polymerization initiator, and a solvent; and
   preparing a quantum dot-containing material by converting the second monomer in the third composition into at least a part of a second matrix material, the quantum dot-containing material comprising the quantum dot-containing complex and the second matrix material, in which the quantum dot-containing complex is dispersed,
   wherein a refractive index of the first matrix material is greater than a refractive index of the second matrix material.

11. The method of claim 10, wherein
   the solvent in the first composition is water,
   the first monomer comprises a water-soluble vinyl-based monomer, a water-soluble acryl-based monomer, a water-soluble acrylamide-based monomer, or any combination thereof,
   the polymerization initiator in the first composition is a water-soluble polymerization initiator, and
   the preparing of the second composition is performed using solution polymerization.

12. The method of claim 11, wherein
   the quantum dot-containing complex is a spherical particle.

13. The method of claim 11, wherein
   the obtaining of the quantum dot-containing complex is performed utilizing lyophilization.

14. The method of claim 11, wherein
   the preparing of the quantum dot-containing material is performed utilizing photopolymerization.

15. The method of claim 11, wherein
   a refractive index of the first monomer is greater than a refractive index of the second monomer.

16. An optical member comprising the quantum dot-containing material of claim 1.

17. The optical member of claim 16, wherein the optical member is a color conversion member.

18. An apparatus comprising the quantum dot-containing material of claim 1.

19. The apparatus of claim 18, wherein the apparatus further comprises a light source, and
   the quantum dot-containing material is arranged in a path of light emitted from the light source.

20. The apparatus of claim 19, wherein the light source is an organic light-emitting device (OLED) or a light-emitting diode (LED).

* * * * *